US010020314B1

(12) United States Patent
Baraskar et al.

(10) Patent No.: US 10,020,314 B1
(45) Date of Patent: Jul. 10, 2018

(54) FORMING MEMORY CELL FILM IN STACK OPENING

(71) Applicant: SanDisk Technologies LLC, Plano, TX (US)

(72) Inventors: Ashish Baraskar, Santa Clara, CA (US); Liang Pang, Fremont, CA (US); Yanli Zhang, San Jose, CA (US); Ching-Huang Lu, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/448,409

(22) Filed: Mar. 2, 2017

(51) Int. Cl.
*H01L 21/336* (2006.01)
*H01L 27/11519* (2017.01)
(Continued)

(52) U.S. Cl.
CPC ......... *H01L 27/11519* (2013.01); *H01L 21/823412* (2013.01); *H01L 27/1157* (2013.01);
(Continued)

(58) Field of Classification Search
CPC ....... H01L 27/11519; H01L 21/823412; H01L 27/11582; H01L 27/1157; H01L 27/11524;
(Continued)

(56) References Cited

U.S. PATENT DOCUMENTS

| 5,434,109 A | 7/1995 | Geissler et al. |
| 9,236,396 B1 | 1/2016 | Koka et al. |

(Continued)

FOREIGN PATENT DOCUMENTS

| CN | 105374826 A | 3/2016 |
| WO | WO2015/038427 A1 | 3/2015 |

OTHER PUBLICATIONS

Chi, Yi-Pen, "Fluorinated oxidation of silicon nitride at low temperatures," Lehigh University, Theses and Dissertations, Paper 480, Jun. 1, 1997, 80 pages.

(Continued)

*Primary Examiner* — Stephen Bradley
*Assistant Examiner* — Wasiul Haider
(74) *Attorney, Agent, or Firm* — Vierra Magen Marcus LLP

(57) ABSTRACT

Disclosed herein are methods of forming non-volatile storage. An opening may be etched through a stack of two alternating materials to a semiconductor substrate. A silicon nitride film may be formed on a vertical sidewall of the opening. The semiconductor substrate may be cleaned to remove oxide from the semiconductor substrate. The silicon nitride film protects the materials in the stack while cleaning the semiconductor substrate. The silicon nitride film may be converted to an oxide after cleaning the semiconductor substrate. A semiconductor region may be formed in contact with the cleaned semiconductor substrate. A memory cell film may be formed over the oxide in the opening. Control gates may be formed by replacing one of the materials in the stack with a conductive material. The oxide may serve as a blocking layer between the control gates and charge storage regions in the memory cell film.

17 Claims, 32 Drawing Sheets

(51) Int. Cl.
*H01L 27/11565* (2017.01)
*H01L 27/11524* (2017.01)
*H01L 27/1157* (2017.01)
*H01L 27/11556* (2017.01)
*H01L 27/11582* (2017.01)
*H01L 21/8234* (2006.01)
*H01L 27/11526* (2017.01)
*H01L 27/11573* (2017.01)

(52) U.S. Cl.
CPC .. *H01L 27/11524* (2013.01); *H01L 27/11556* (2013.01); *H01L 27/11565* (2013.01); *H01L 27/11582* (2013.01); *H01L 27/11526* (2013.01); *H01L 27/11573* (2013.01)

(58) Field of Classification Search
CPC ......... H01L 27/11565; H01L 27/11556; H01L 27/11573; H01L 27/11526

See application file for complete search history.

(56) References Cited

U.S. PATENT DOCUMENTS

| | | | |
|---|---|---|---|
| 9,543,318 B1 | 1/2017 | Lu et al. | |
| 2011/0121403 A1* | 5/2011 | Lee | H01L 27/11526 257/390 |
| 2013/0341702 A1* | 12/2013 | Kar | H01L 29/1045 257/324 |
| 2015/0076586 A1* | 3/2015 | Rabkin | G11C 16/0483 257/324 |
| 2015/0155297 A1* | 6/2015 | Eom | H01L 27/11582 438/268 |
| 2015/0236038 A1 | 8/2015 | Pachamuthu et al. | |
| 2016/0211272 A1 | 7/2016 | Koka et al. | |
| 2017/0287929 A1* | 10/2017 | Kim | H01L 27/11582 |

OTHER PUBLICATIONS

International Search Report & The Written Opinion of the International Searching Authority dated Feb. 22, 2018, International Application No. PCT/US2017/063398.

English Abstract of CN Publication No. CN105374826 published on Mar. 2, 2016.

* cited by examiner

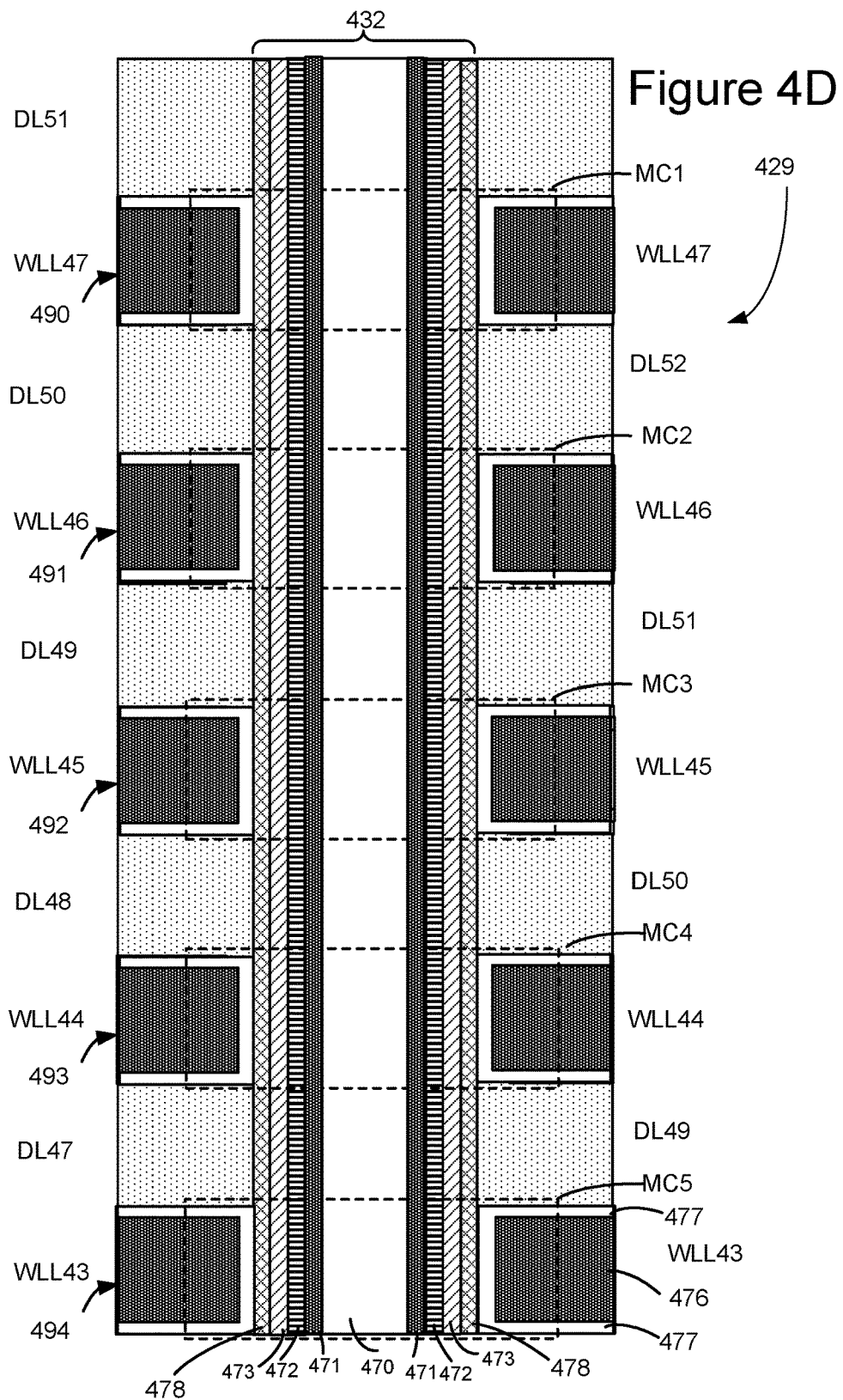

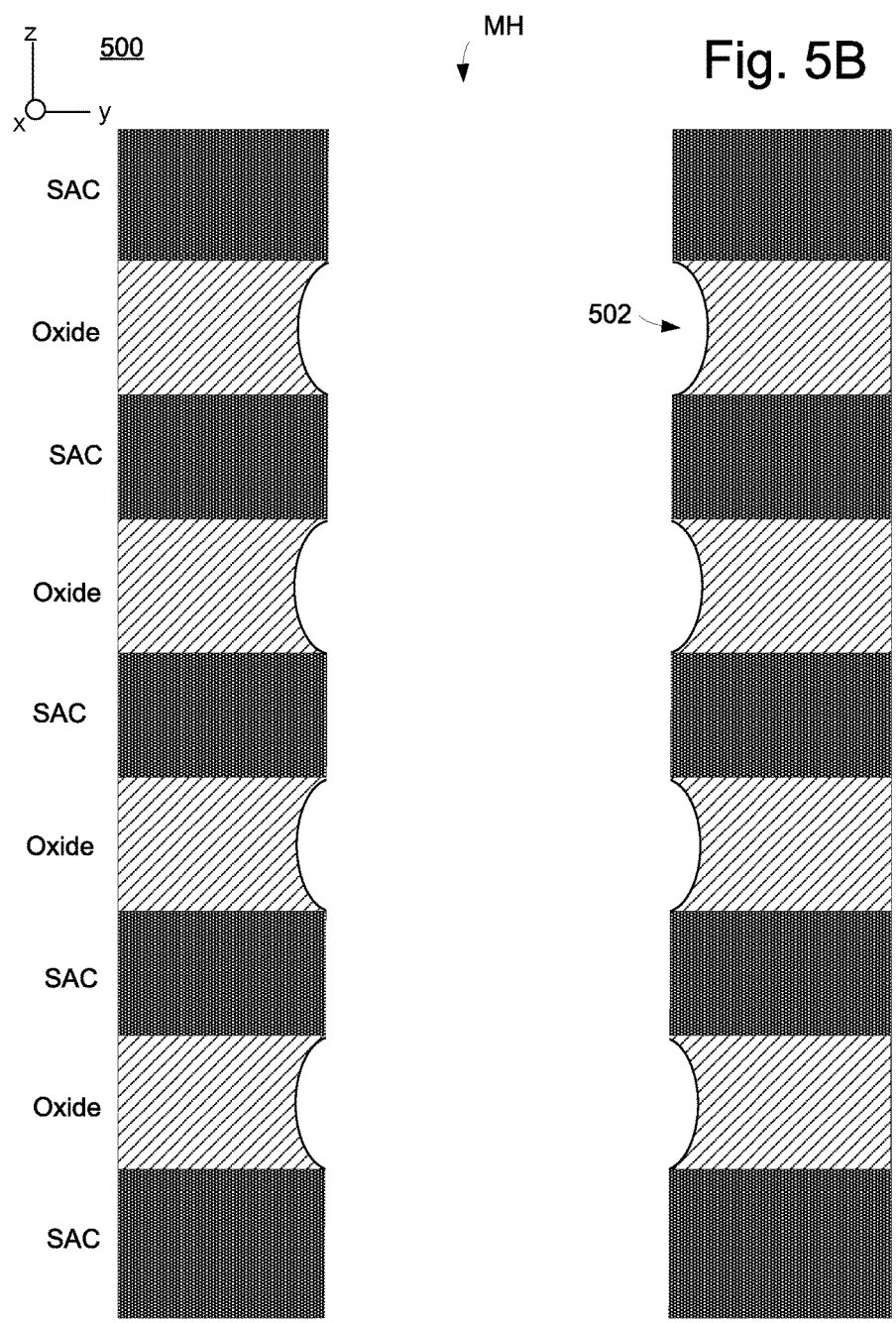

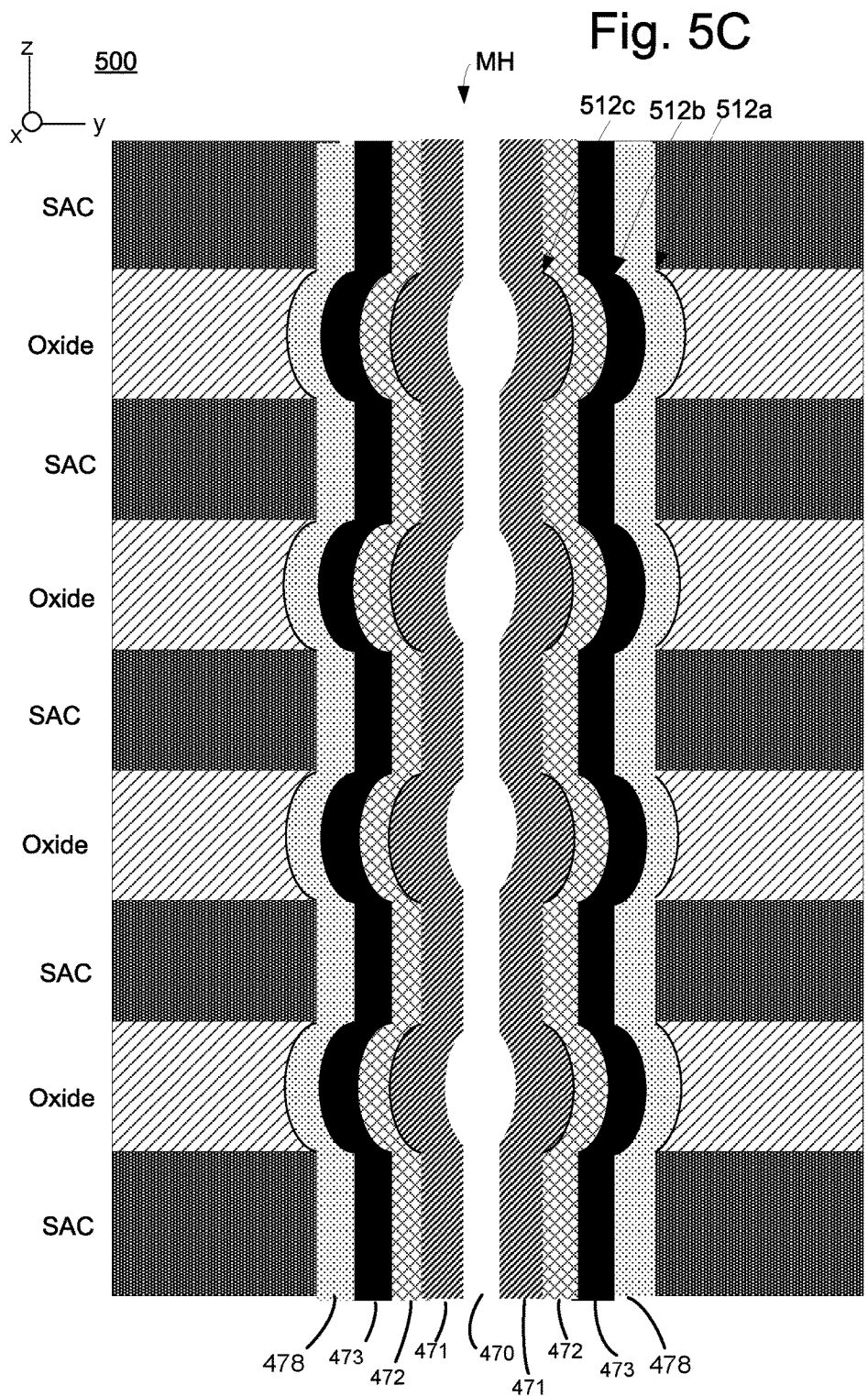

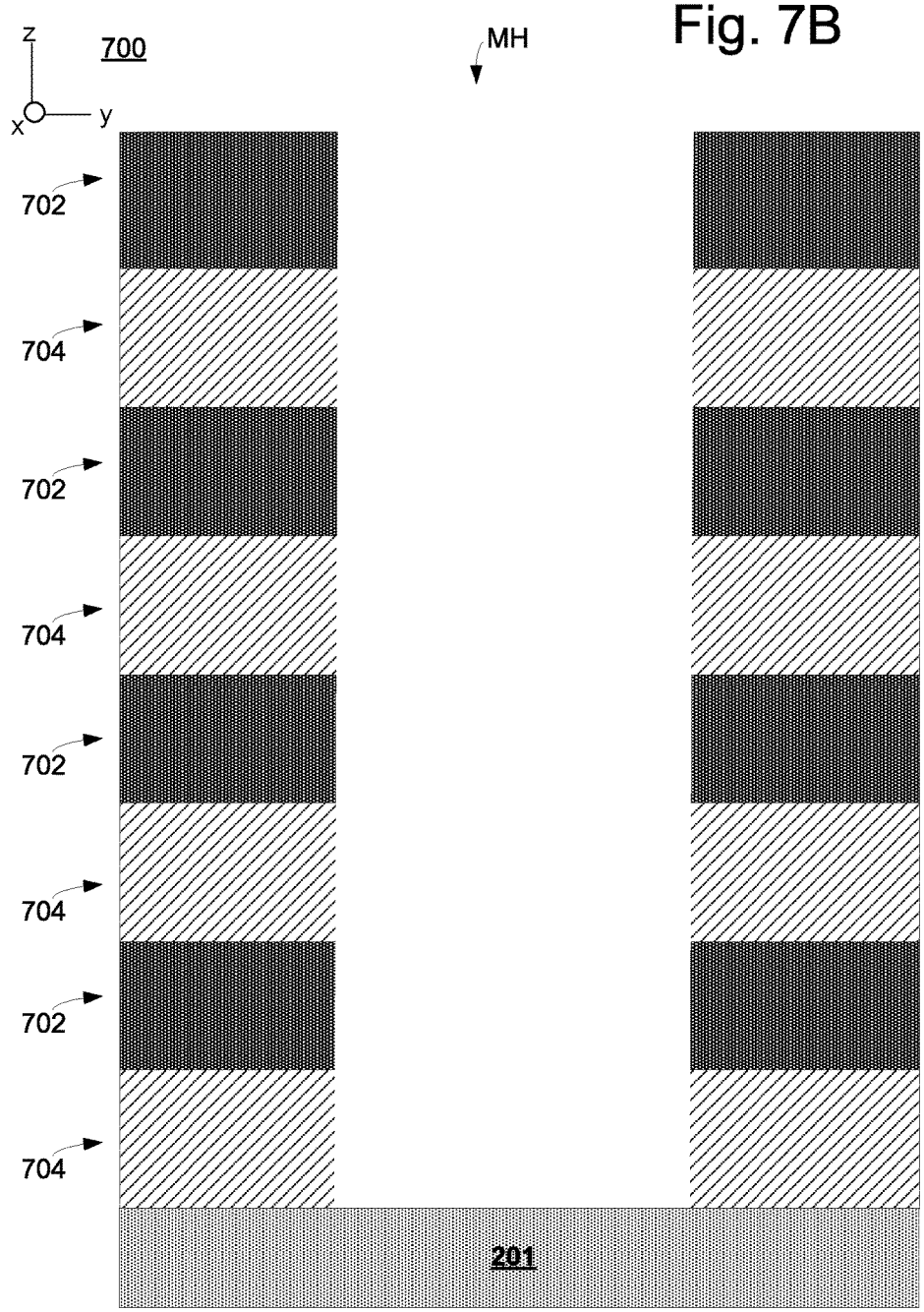

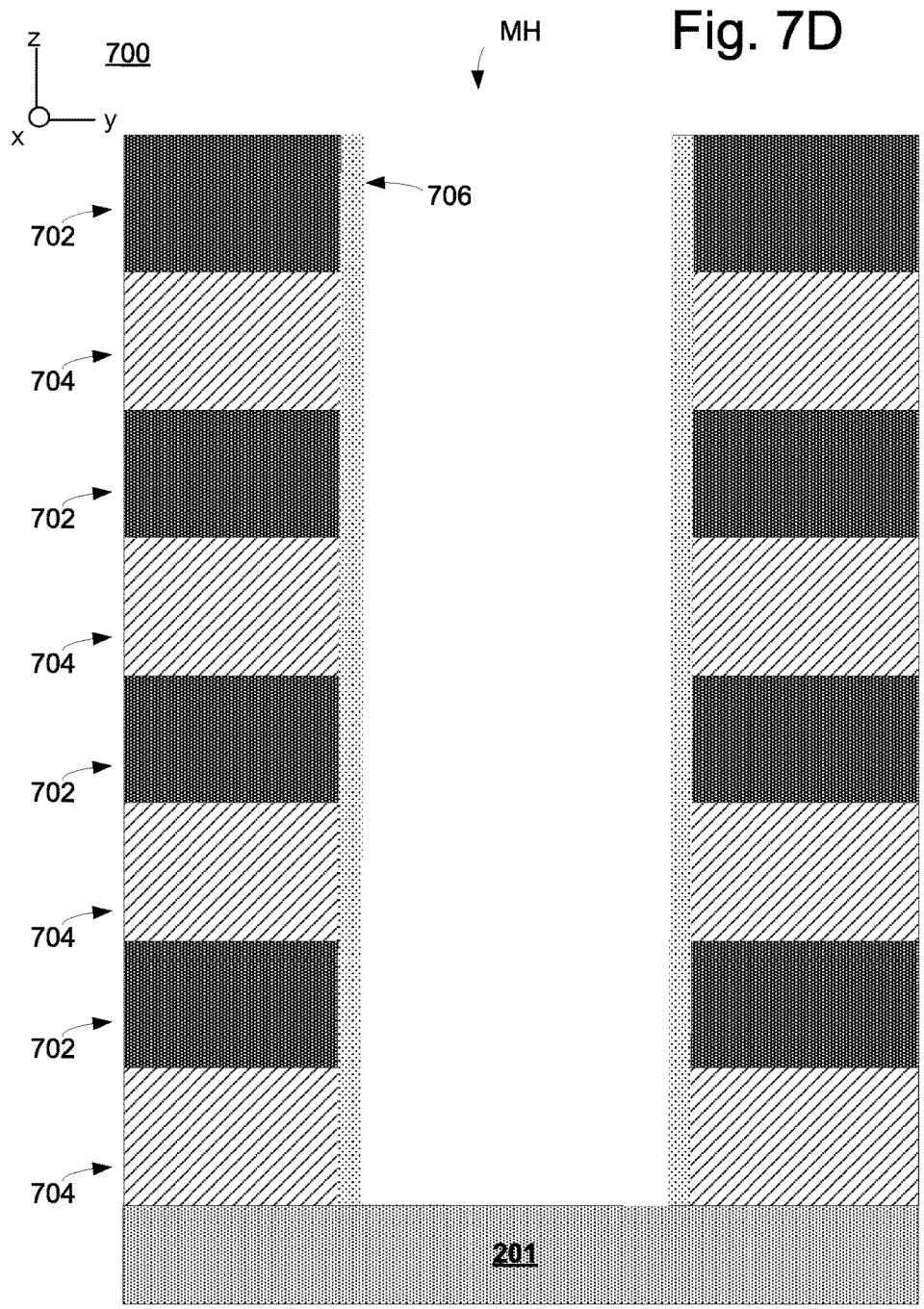

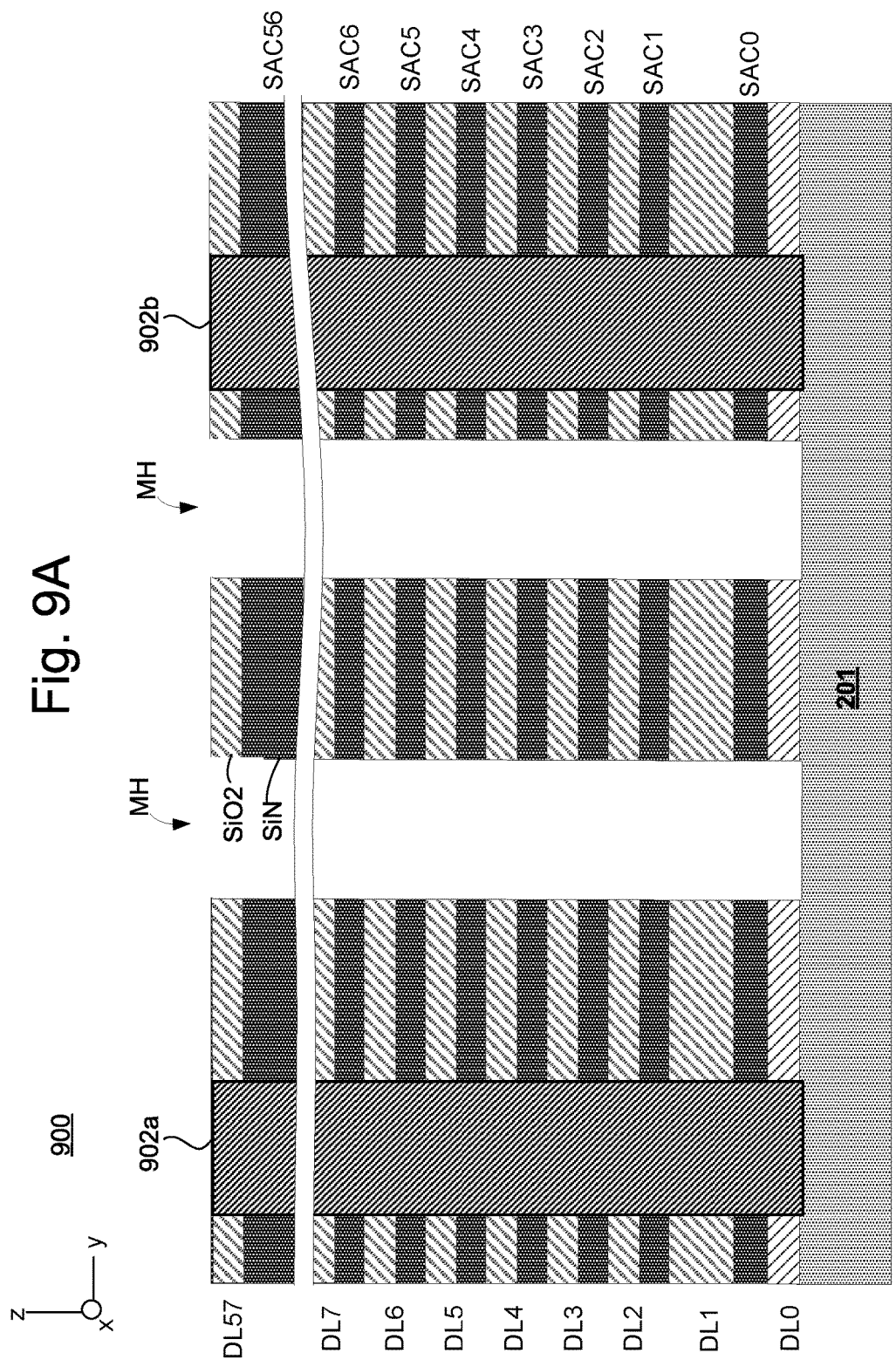

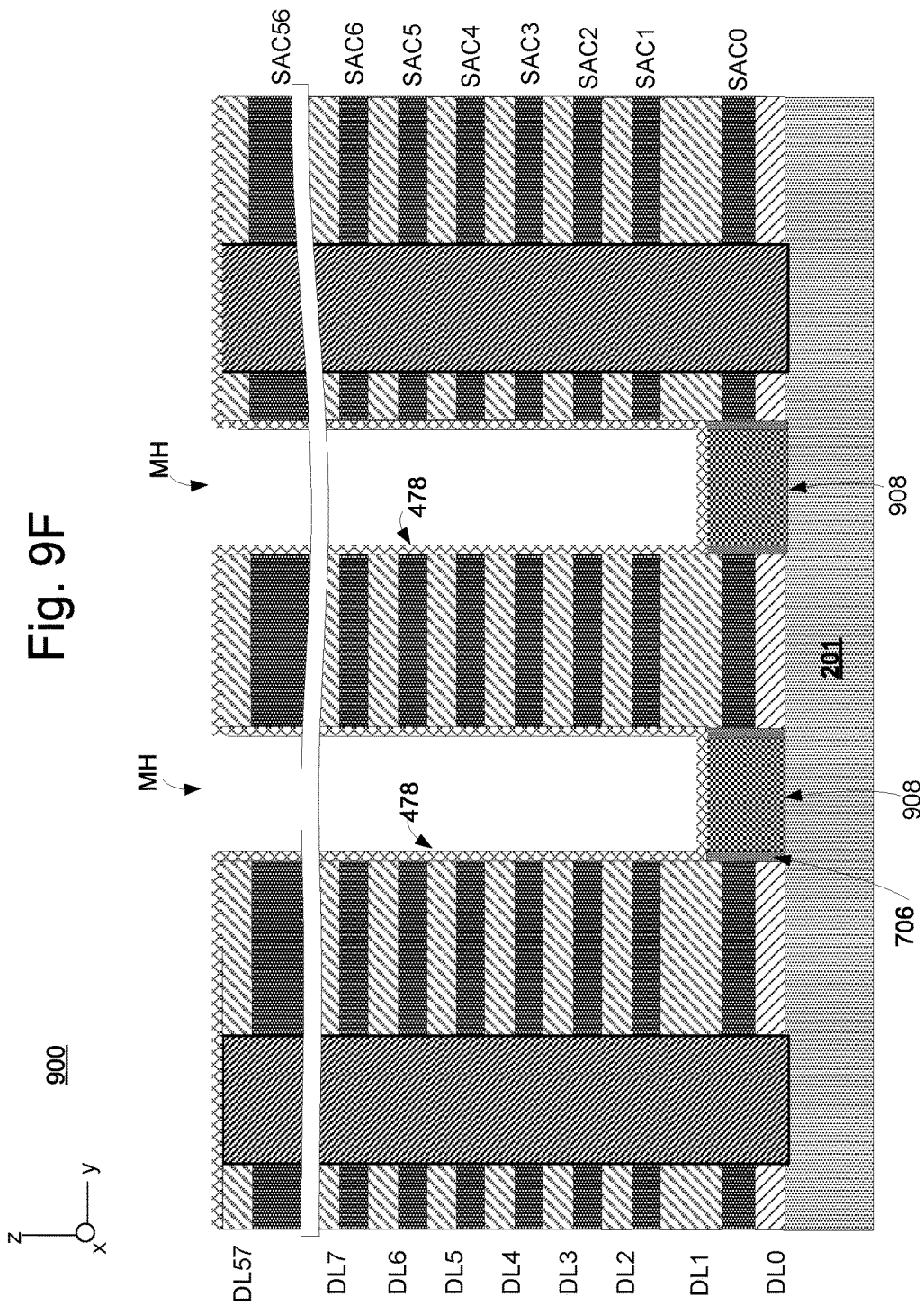

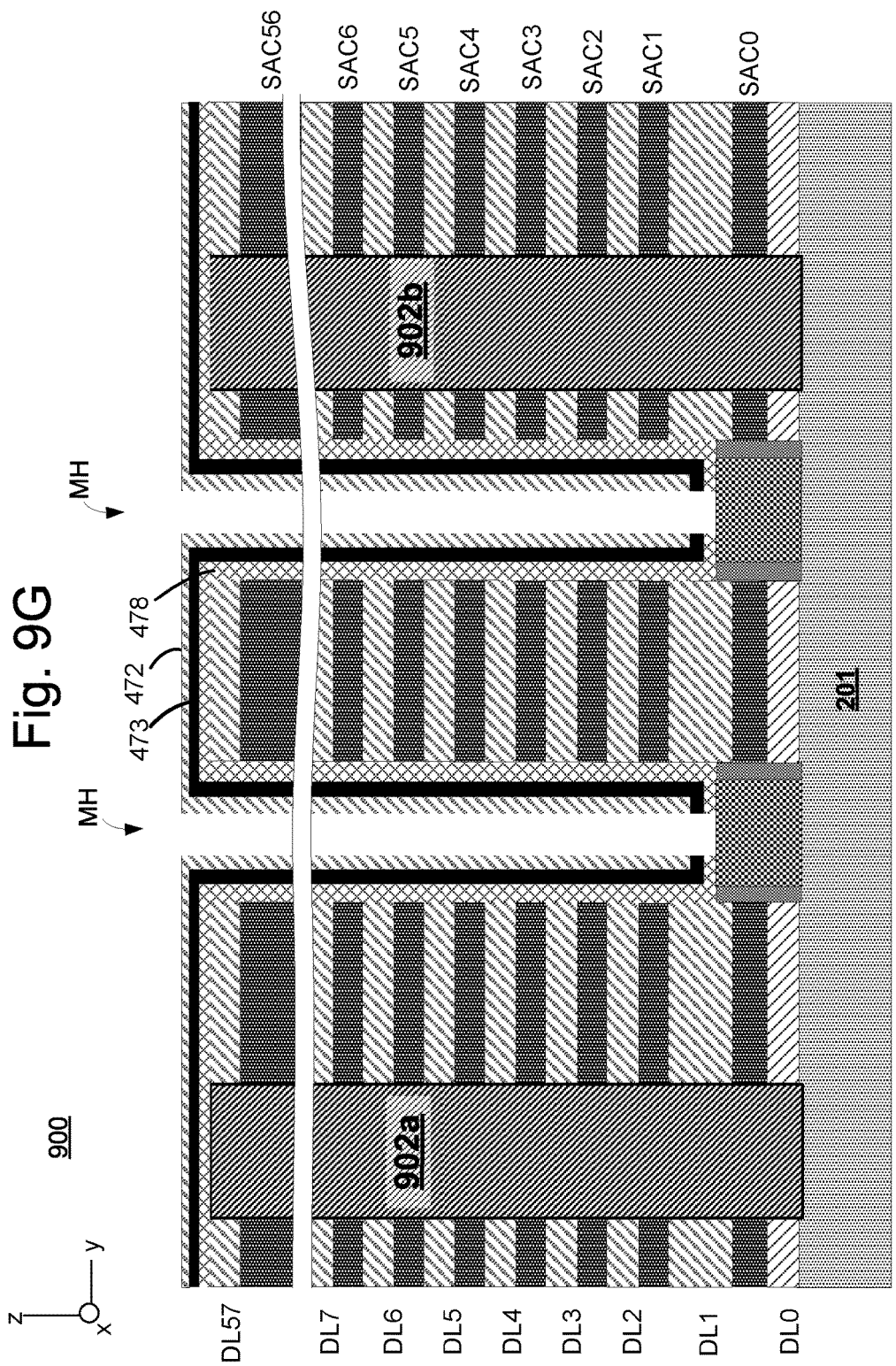

FORMING MEMORY CELL FILM IN STACK OPENING

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. Control gates of the memory cells are provided by the conductor layers. Select gates are formed at either end of the memory hole.

BRIEF DESCRIPTION OF THE DRAWINGS

Like-numbered elements refer to common components in the different figures.

FIG. 4D depicts a cross sectional view of region 429 of FIG. 4C.

FIGS. 5A-5D illustrate a possible problem with formation of memory cell film with memory openings.

FIGS. 7A-7I depict details of embodiments of various steps of process 600.

FIGS. 9A-9J depict results after various steps of process 800 of FIG. 8.

DETAILED DESCRIPTION

Figure 1:
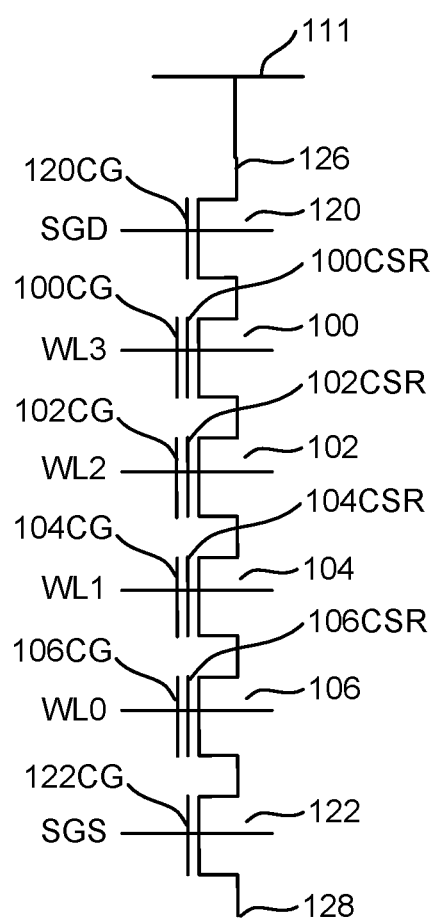
FIG. 1 is a circuit representation of a NAND string.

Disclosed herein are methods of forming a memory cell film in an opening in a stack of two different materials. The stack is alternating layers of a sacrificial material and silicon oxide, in one embodiment. The sacrificial material is silicon nitride, in one embodiment. The stack is formed over a semiconductor substrate, in one embodiment. An opening is etched through the stack to the semiconductor substrate, in one embodiment. The opening has a vertical sidewall in which the first and second materials are exposed. A memory cell film may be formed in the opening.

As will be discussed more fully below, it is possible for a cleaning step (e.g., dilute hydrofluoric acid (DHF) clean) to cause cavities in one of the materials of the vertical sidewalls of the opening. These cavities can cause the contour of the opening being somewhat wavy (from top to bottom). As noted, a memory cell film may be formed in the opening. The memory cell film may form a conformal layer over the vertical sidewall of the opening. Therefore, the contour of the memory cell film may be somewhat wavy, which can impact memory cell array operation. For example, the wavy memory cell film contour could result in parasitic charge trapping in portions of the memory cell film. The parasitic charge trapping can possibly result in interference between neighboring memory cells.

In one embodiment, a silicon nitride film is formed on the vertical sidewall of the opening. The silicon nitride film protects the first and/or second materials in the stack while the semiconductor substrate is being cleaned. For example, oxide may be removed from the semiconductor substrate, such that the semiconductor substrate is in good condition to serve as a crystalline substrate for epitaxial growth. Note that the process of removing the oxide from the semiconductor substrate could potentially damage the first and/or second material if the silicon nitride film is not in place. For example, silicon oxide in the stack could potentially be partially etched away when cleaning oxide from the semiconductor substrate if the silicon nitride film is not in place.

After cleaning the semiconductor substrate, a body for a source side select transistor is formed in direct contact with the semiconductor substrate, in one embodiment. The body may be formed using the semiconductor substrate as a crystalline substrate for epitaxial growth. The protective silicon nitride film may be converted to an oxide. This oxide may eventually serve as a blocking layer between control gates and charge storage regions of memory cells. A memory cell film is formed in the opening over the oxide, in one embodiment. In one embodiment, control gates are formed by replacing one of the materials in the stack with a conductive material.

Embodiments disclosed herein reduce or prevent cavities in the second material along vertical sidewall of the opening. The opening has a contour that is straight, or nearly straight, from top to bottom, in accordance with embodiments. Embodiments disclosed herein produce a memory cell film that is straight, or nearly straight, from top to bottom in the opening. Fabrication techniques disclosed herein are economical, and can easily be integrated into semiconductor fabrication processes. Embodiments disclosed herein result in a memory cell film that is not as susceptible to parasitic charge trapping as a memory cell film formed in an opening with a wavy contour. Embodiments disclosed herein fabricate 3D memory in a manner that reduces (or prevents) interference from neighboring memory cells.

One example of a non-volatile storage system that can be fabricated with the technology described herein is a flash memory system that uses the NAND structure, which includes arranging multiple memory cell transistors in series, sandwiched between two select transistors. However, other types of memory can be fabricated with technology described herein.

The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 100CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) forms at least a portion of a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—SiO, in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

Figure 2:
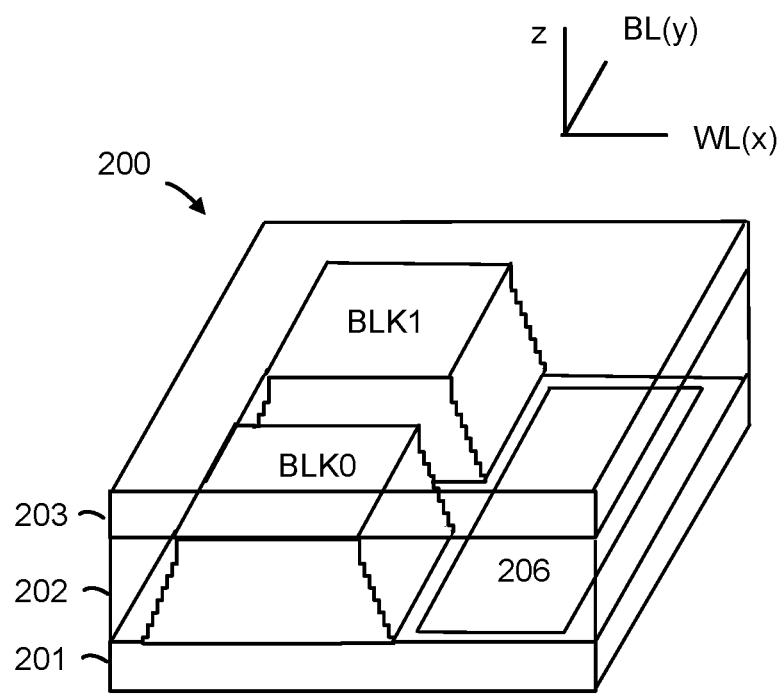
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. Thus, the substrate 201 may be a semiconductor substrate. The substrate 201 may be a crystalline semiconductor. The crystalline semiconductor may be single crystal semiconductor. The substrate 201 may be a semiconductor wafer. The substrate 201 has a major surface that extends in the x-y plane, in one embodiment.

On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3:
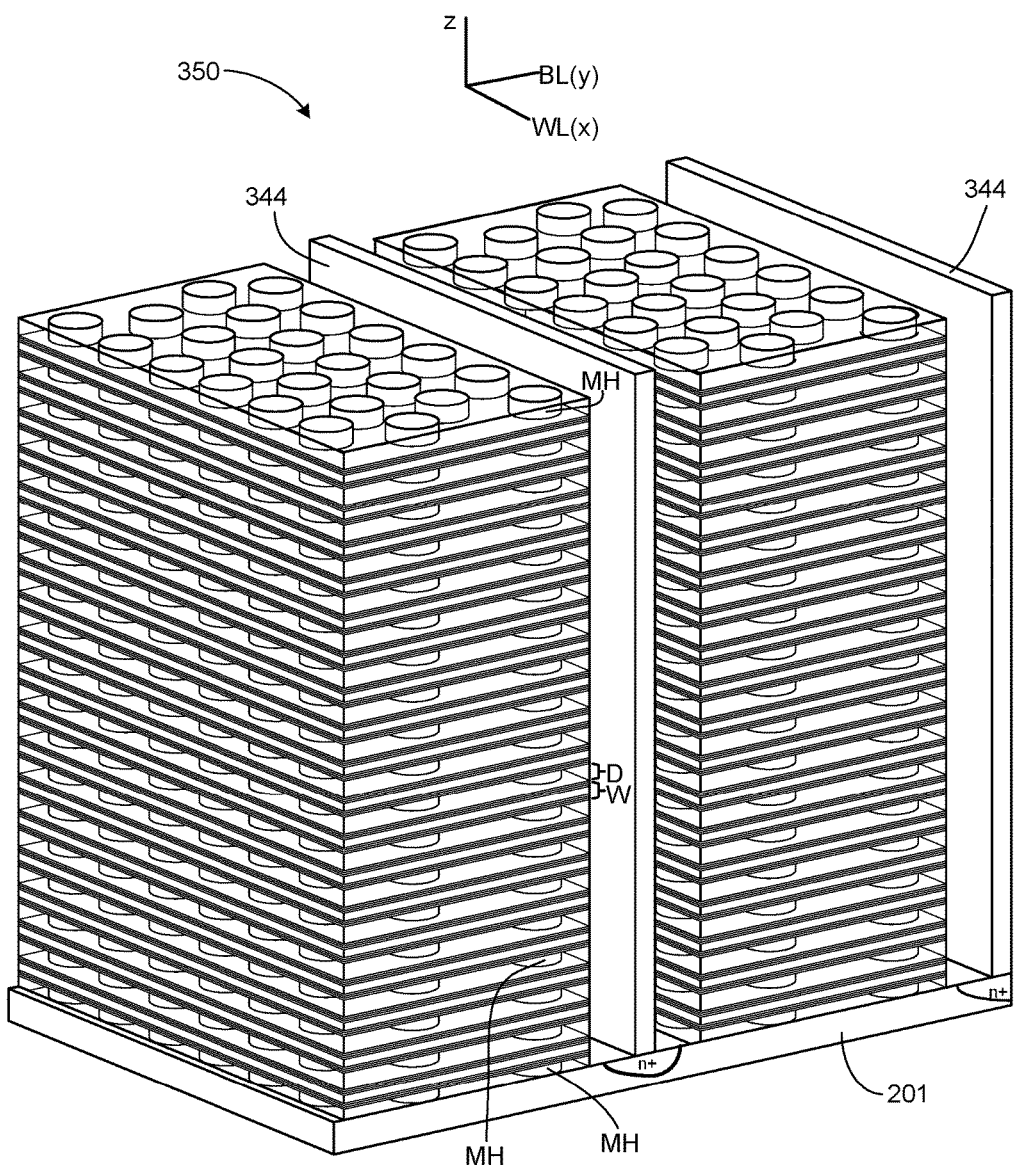
FIG. 3 is a perspective view of a portion of a three dimensional monolithic memory structure.

FIG. 3 is a perspective view of a portion of a three dimensional monolithic memory structure 350, which includes a plurality memory cells. For example, FIG. 3 shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, eight select layers, four dummy word line layers and 108 dielectric layers. More or fewer than 108-216 layers can also be used. The alternating dielectric layers and conductive layers are divided into "fingers" by local source lines 344. Note that the local source lines 344 may also be referred to as local interconnects LI. FIG. 3 only shows two fingers and two local interconnects LI. The local source lines 344 are conductive elements. Below and the alternating dielectric layers and word line layers is a substrate 201. Each local source line 344 is in electrical contact with an n+ diffusion region of the substrate 201, in one embodiment. Note that the local source lines 344 each have a major plane that extends in the x-z plane.

Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 4A:
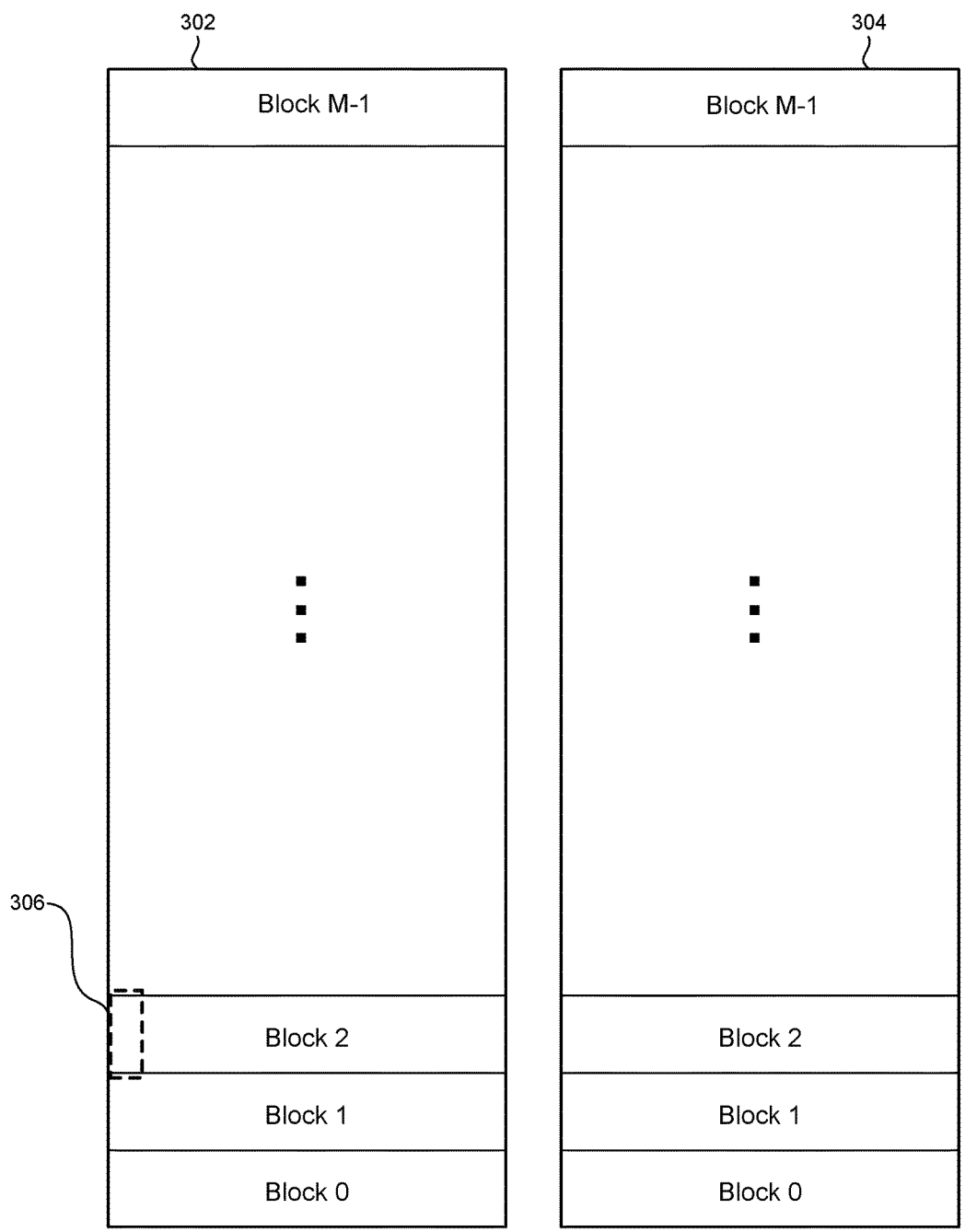
FIG. 4A is a block diagram explaining one example organization of memory structure.

FIG. 4A is a block diagram explaining one example organization of memory structure 350, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
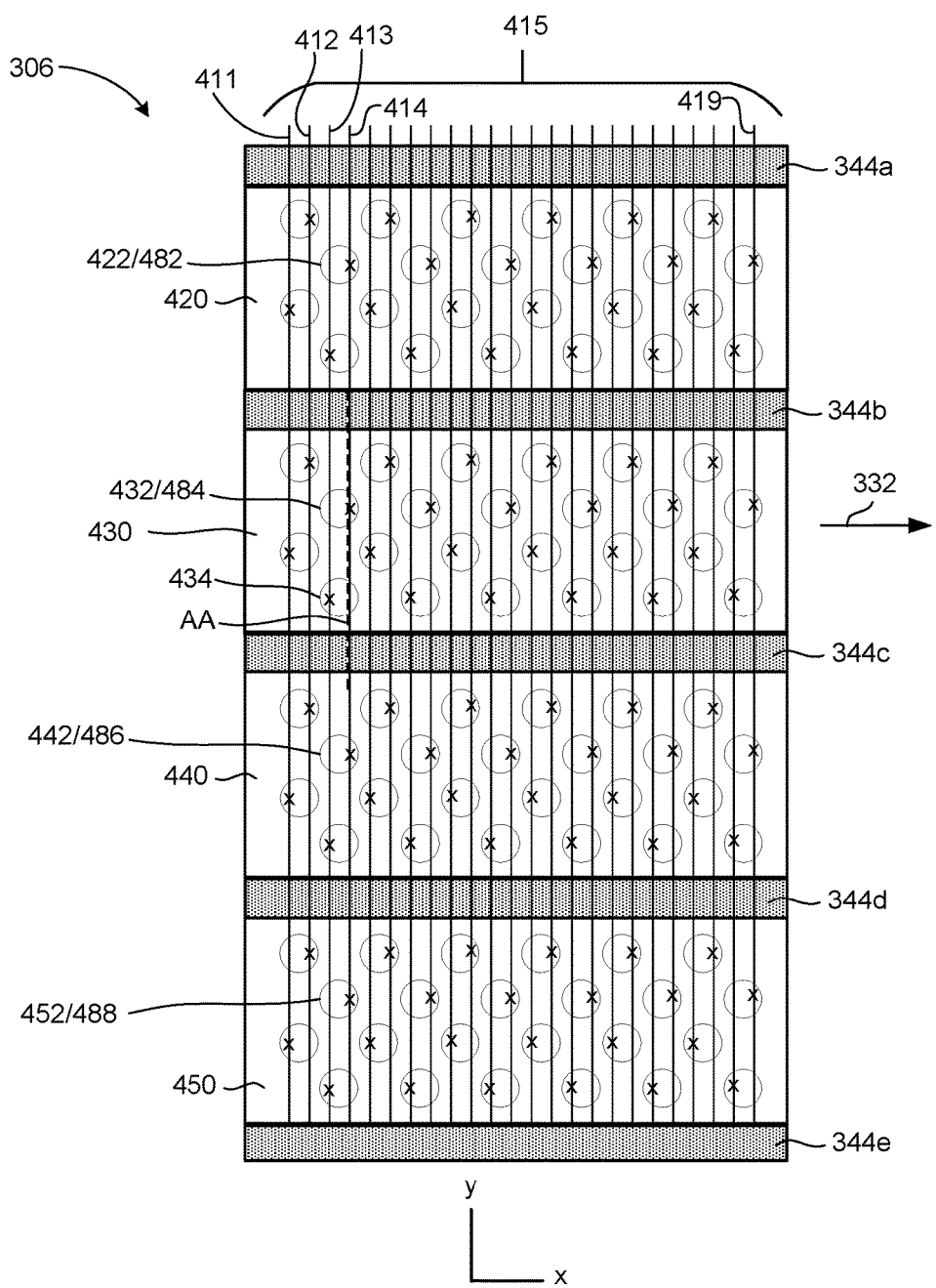
FIG. 4B depicts a plurality of circles that represent the vertical columns.
Figure 4C:
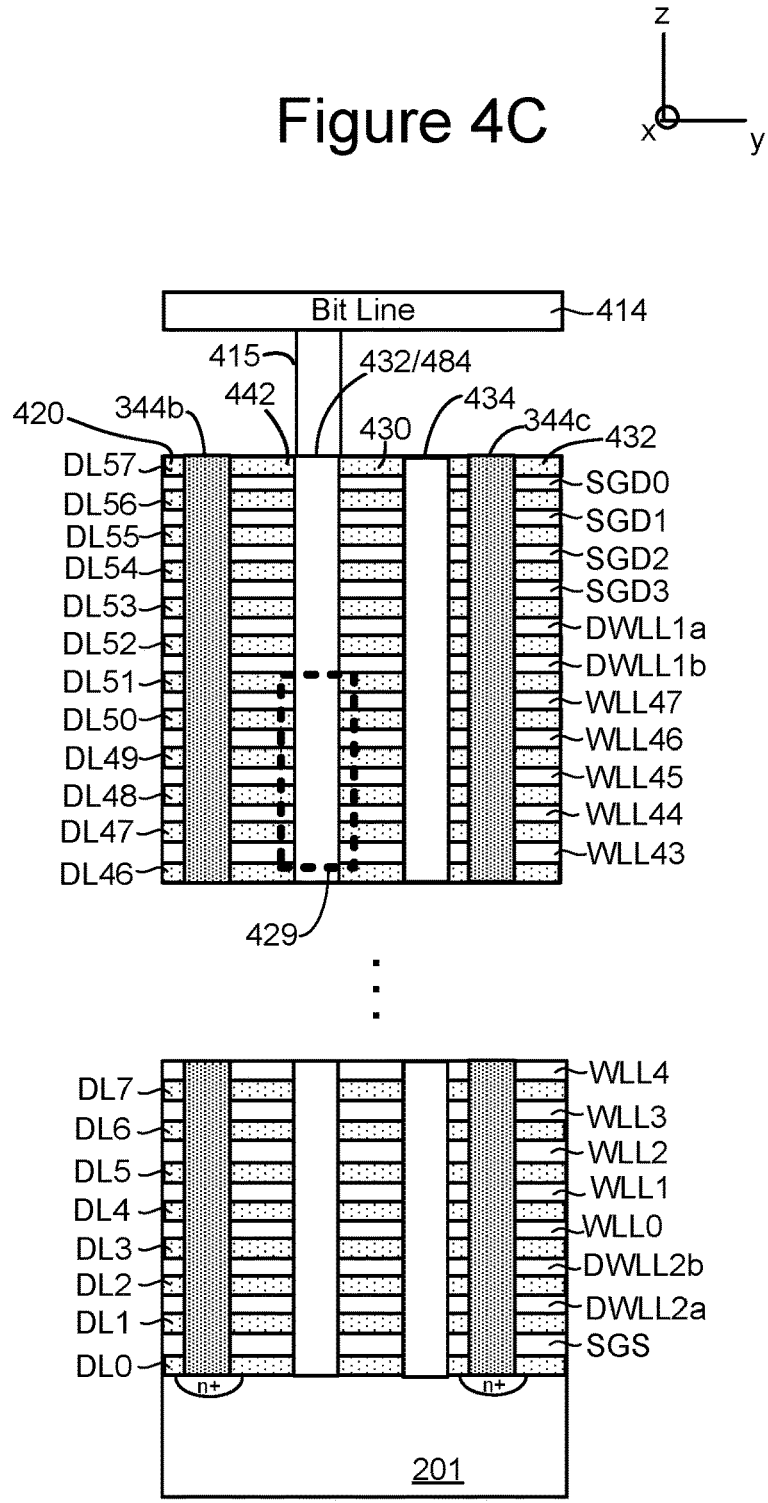
FIG. 4C depicts a portion of an embodiment of three dimensional memory structure showing a cross-sectional view along line AA of FIG. 4B.

FIGS. 4B-4D depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4B also shows the vertical columns being staggered. In other embodiments, different patterns of staggering can be used. In some embodiments, the vertical columns are not staggered.

FIG. 4C depicts a portion of an embodiment of three dimensional memory structure 350 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; one source side select layer SGS; four dummy word line layers DWLL1a, DWLL1b, DWLL2a and DWLL2b; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is substrate 201. Local source lines 344a, 344c are in direct electrical contact with the substrate 201. The substrate 201 has n+ regions at the contact point. The NAND string of vertical column 432 has a source end at a bottom of the stack and a drain end at a top of the stack. As in agreement with FIG. 4B, FIG. 4C show vertical column 432 connected to Bit Line 414 via connector 415.

For ease of reference, drain side select layers SGD0, SGD1, SGD2 and SGD3; source side select layer SGS; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL57. For example, dielectric layers DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layer SGS is used to electrically connect and disconnect NAND strings from the local source lines 344.

FIG. 4D depicts a cross sectional view of region 429 of FIG. 4C that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as SiO$_2$. Other materials can also be used. Surrounding inner core 470 is semiconductor channel 471. Semiconductor channel 471 is polysilicon, in one embodiment. Materials other than polysilicon can also be used. Note that it is the channel 471 that connects to the bit line. Surrounding semiconductor channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DL47, DL48, DL49, DL50, and DL51, as well as word line layers WLL43, WLL44, WLL45, WLL46, and WLL47. Each of the word line layers includes a word line region 476 surrounded by an aluminum oxide layer 477. The physical interaction of the word line layers with the vertical column forms the memory cells. Thus, a memory cell, in one embodiment, comprises channel 471, tunneling dielectric 472, charge trapping layer 473, oxide layer (e.g., silicon oxide, silicon oxynitride) 478, aluminum oxide layer 477 and word line region 476. Together, the aluminum oxide layer 477 and the oxide layer 478 may be referred to as a blocking layer. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories can also be used.

An alternative to the embodiment of FIG. 4D, is to form the aluminum oxide layer 477 entirely within the vertical column 432. Thus, aluminum oxide layer 477 could be formed roughly where oxide layer 478 is depicted. Other layers 471, 472, 473, 478 can be moved inward.

In some embodiments, fabricating the 3D memory includes forming alternating layers of silicon oxide and silicon nitride. Then, memory holes are formed in the alternating layers. A memory cell film is formed in the memory holes. The silicon nitride are sacrificial layers, which are removed and replaced with conductive material that serves as control gates for the memory cells. FIGS. 5A-5D depict a close-up view of alternating layers of silicon oxide and silicon nitride with a memory hole. FIGS. 5A-5D will be used to explain a possible problem with formation of memory cell film with memory openings.

Figure 5A:
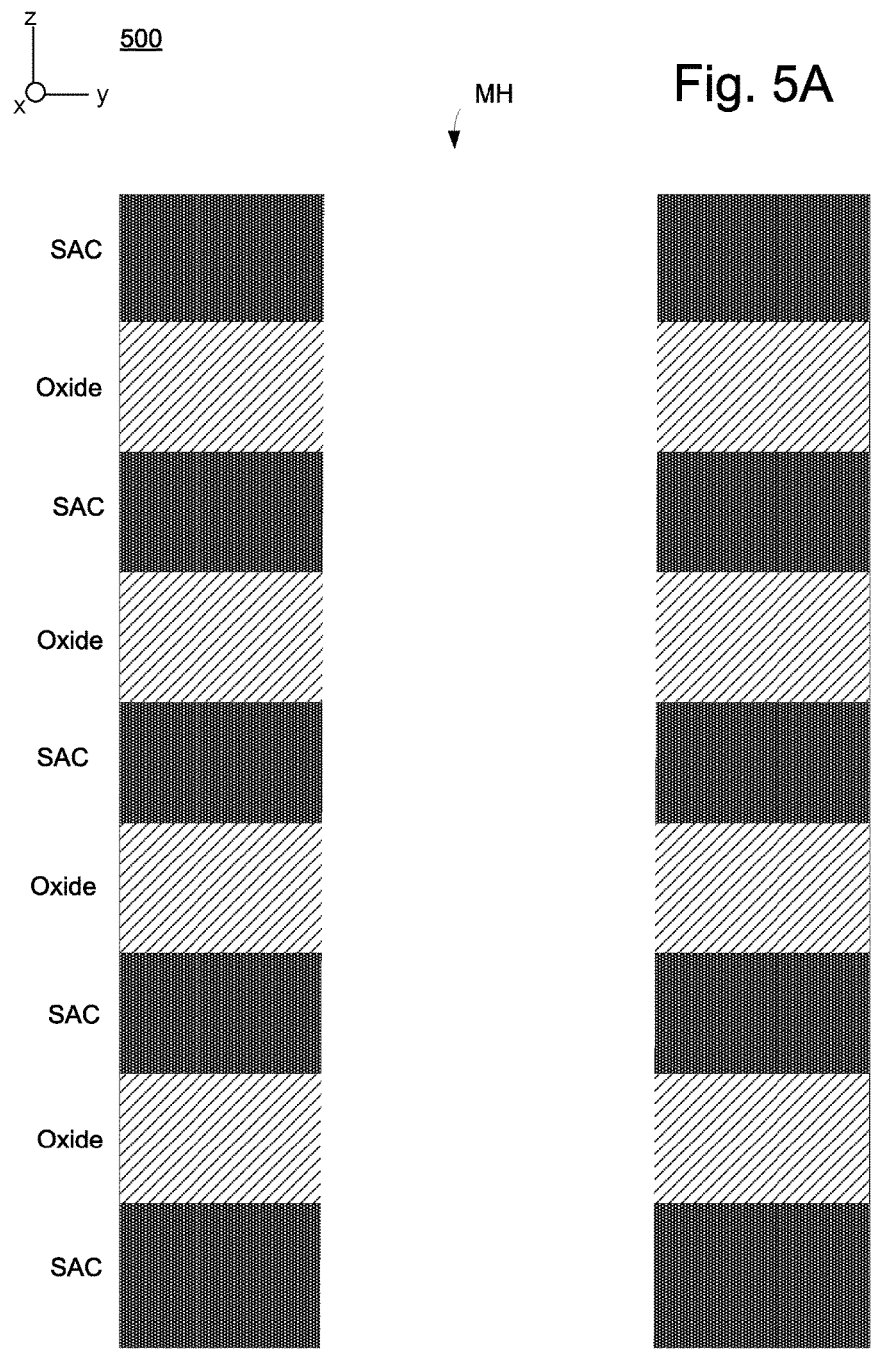

FIG. 5A depicts alternating layers of oxide (e.g., silicon oxide) and a sacrificial material (SAC) (e.g., silicon nitride (SiN), polysilicon, etc.) with a memory hole (MH) formed in a stack 500. The alternating layers could be formed over a crystalline silicon substrate (not depicted in FIG. 5A). The substrate could be a semiconductor other than silicon. The memory hole could have roughly the shape of a cylinder. After forming the memory hole, it may be desirable to perform a cleaning step in preparation for forming materials within the memory hole. For example, a surface of the crystalline silicon substrate could have some oxidation that results from various processing steps. The surface being referred to here is the surface that is exposed at the bottom of the memory hole. It may be desirable to clean the surface of the crystalline silicon substrate. For example, it may be desirable to remove oxide from the surface of the crystalline silicon substrate.

One type of cleaning step is a dilute hydrofluoric acid (DHF) clean (or DHF dip). The DHF clean removes residual oxide. For example, the DHF clean can be used to remove silicon oxide from a surface of silicon such as, the silicon substrate. However, the DHF clean could possibly etch exposed portions of the oxide on vertical sidewalls of the memory holes. This etching of the exposed portions of the oxide on vertical sidewalls of the memory holes may be undesirable.

FIG. 5B shows cavities 502 that could form in the oxide as a result of the DHF clean. As noted above, the intent of the DHF clean may be to clean oxide from a surface, such as the semiconductor substrate. Thus, the cavities 502 may be an unintentional result of the DHF clean. In this example, the cavities leave the oxide with a convex shape. This shape of the cavities 502 may be due to somewhat slower etching at the interface between oxide (e.g., silicon oxide) and sacrificial material (e.g., silicon nitride). Note that the DHF clean may could also etch the sacrificial material to a small extent. However, the DHF clean may etch the oxide (e.g., silicon oxide) at a faster rate than the sacrificial material. The vertical sidewall of the memory hole has a "wavy" contour in the direction from top to bottom.

FIG. 5C shows a memory cell film formed in the memory hole after the DHF clean. For the sake of comparison, the layers of memory cell film in FIG. 5C, are similar to those depicted in FIG. 4D. Thus, FIG. 5C depicts core 470, channel 471, tunneling dielectric 472, charge trapping layer 473, and oxide layer 478. Layers 471, 472, 473, 478 may be referred to as a "memory cell film" in this context.

When oxide layer 478 is deposited, it may form a conformal layer over the vertical sidewalls of the memory hole. Because of the cavities 502 in the oxide of the vertical sidewall of the memory hole, oxide layer 478 may have a discontinuity 512a at each interface between an oxide layer and a sacrificial layer. Likewise, when charge trapping layer 473 is deposited, it may form a conformal layer over oxide layer 478. Because of the discontinuity 512a in oxide layer 478, charge trapping layer 473 may have a discontinuity 512b at each interface between an oxide layer and a sacrificial layer. Likewise, when tunneling dielectric layer 472 is deposited, it may form a conformal layer over charge trapping layer 473. Because of the discontinuity 512b in charge trapping layer 473, dielectric layer 472 may have a discontinuity 512c at each interface between an oxide layer and a sacrificial layer. Moreover, the memory cell film has a wavy contour.

Figure 5D:
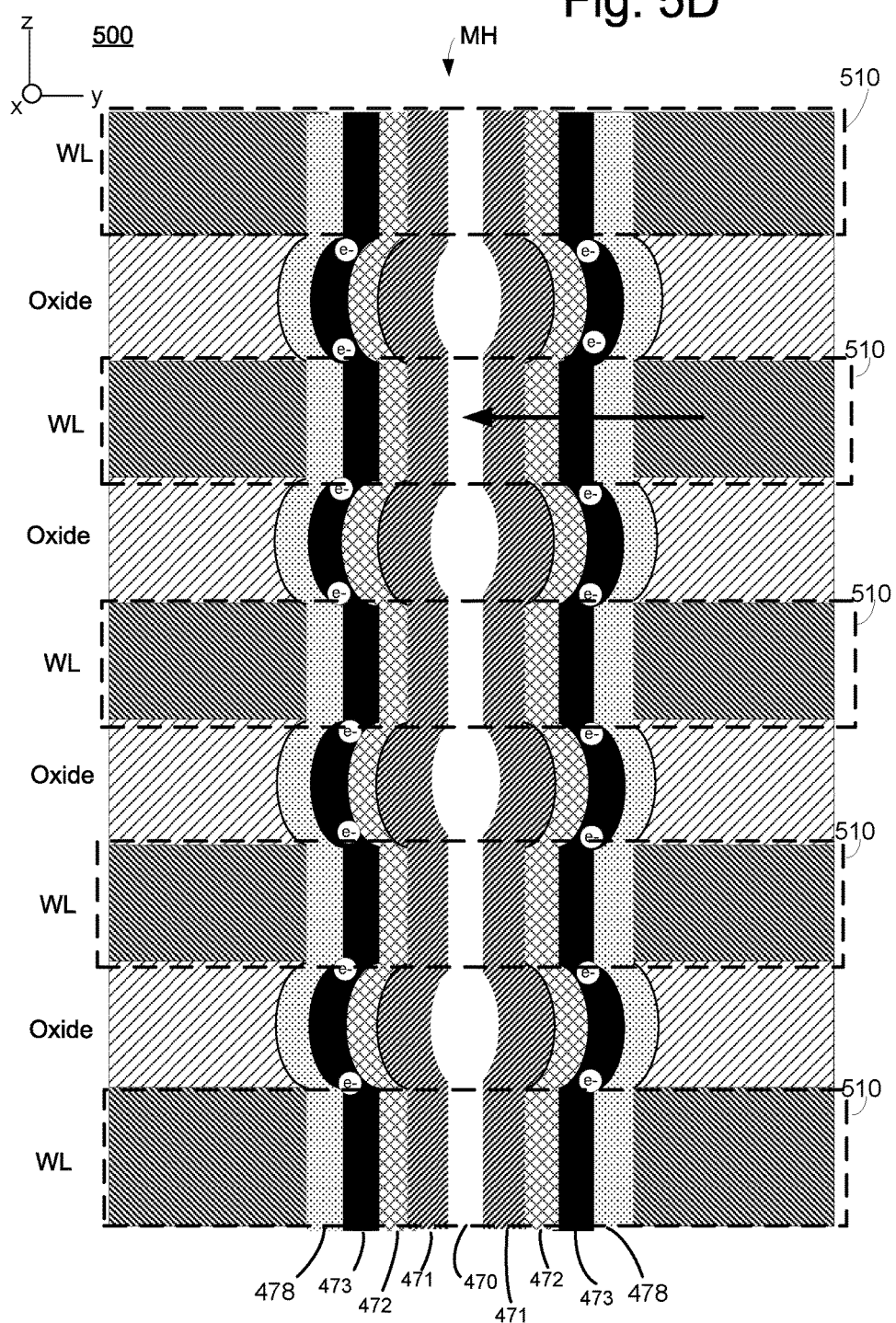

FIG. 5D shows the stack after the sacrificial material (e.g., silicon nitride, polysilicon) has been replaced by tungsten for word lines (or control gates). The word lines (WL) could be formed from a conductive material other than tungsten. Also, there could be a blocking layer outside of the memory holes, such as the aluminum oxide region 477 depicted in FIG. 4D. Thus, the memory cell film could be formed from different layers than depicted in FIG. 5D.

A number of memory cells 510 are depicted. During operations such as programming, reading, or erase, a first voltage may be applied to the word line (WL) and a second voltage applied to the channel 471. For some operations, the WL voltage is higher than the channel voltage. However, the channel voltage could be higher than the WL voltage. In either case, the voltages may result in an electrical field. The arrow in FIG. 5D represents a direction of an electric field for when the higher voltage is applied to the word line (as in, for example, a programming or read operation). The wavy contour of the memory cell film can result in a "fringe" electric field, as well. The fringe electric field is not depicted in FIG. 5D.

FIG. 5D depicts a few trapped parasitic charges in the charge trapping layer 473 (represented by electrons, or "e-"), which could result from the fringe electric field. Such trapped parasitic charges may occur during operations such as programming, reading, or erase. Note that the actual number of trapped electrons may be quite different from representation in FIG. 5D. Also, the distribution of trapped parasitic charges is not necessarily uniform. For example, there may be a different number of electrons for different memory cells. Also, there may be electrons in the charge trapping layer 473 in the region immediately adjacent to the word lines, which result from programming the memory cells. However, those electrons are not depicted in FIG. 5D.

The trapped parasitic charges may impact the threshold voltage of a memory cell. Under one scenario, a memory cell that is programmed to a high threshold voltage may be an "attacker" and a memory cell that is programmed to a low threshold voltage may be a "victim". For example, the threshold voltage of the victim memory cell may be increased due to the trapped parasitic charges near the victim memory cell. This may be referred to as neighbor word line interference.

Figure 6:
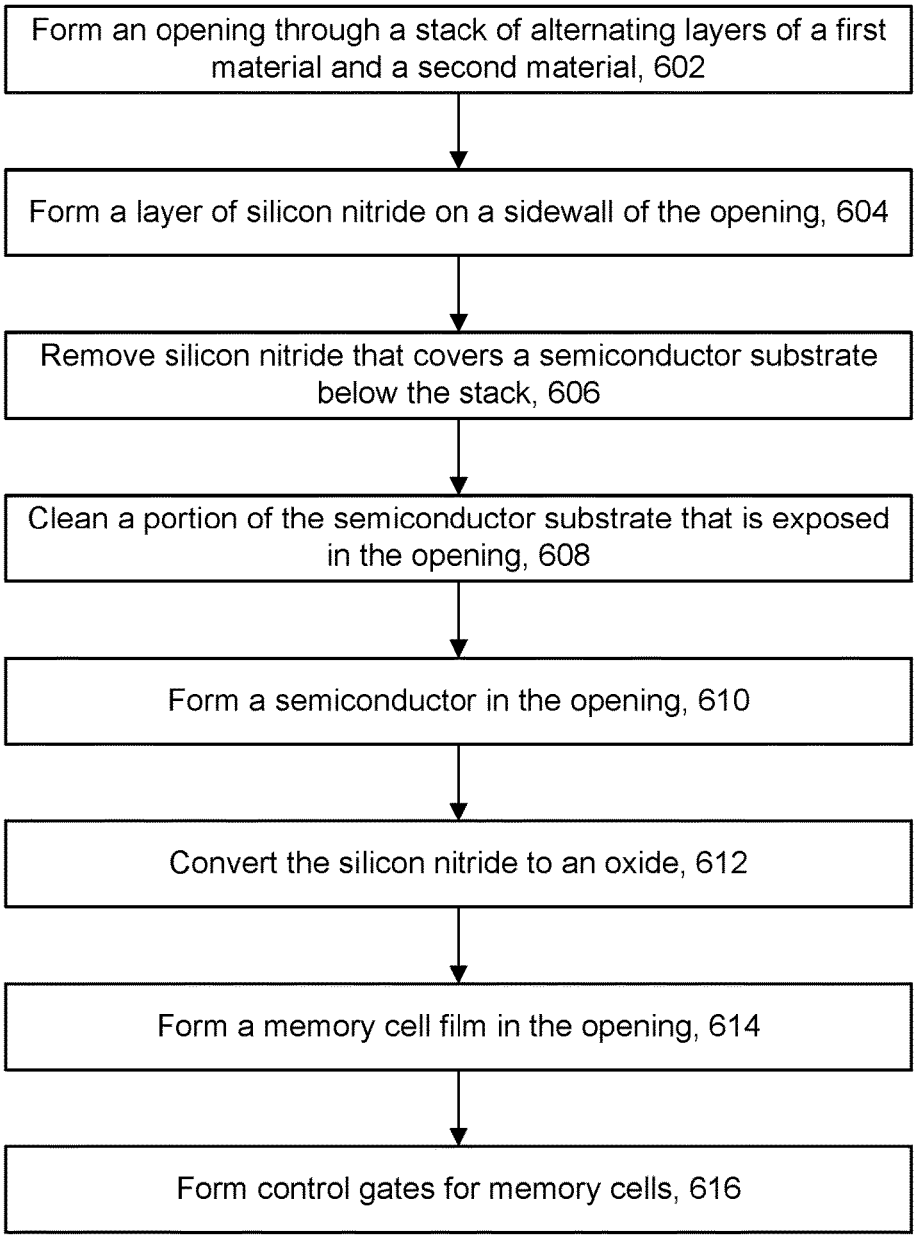
FIG. 6 is a flowchart of one embodiment of a process 600 of fabricating 3D non-volatile storage.

FIG. 6 is a flowchart of one embodiment of a process 600 of fabricating 3D non-volatile storage. The process 600 could be used to fabricate 3D NAND memory, but is not so limited. In general, the process 600 can be used to form 3D memory in which a memory cell film is formed on a vertical sidewall of a memory hole, which is formed in alternating layers of a first material and a second material. FIGS. 7A-7I depict details of embodiments of various steps of process 600. In one embodiment, process 600 is used when forming a NAND string. Process 600 could be used to when forming a structure which as three dimensional monolithic memory structure 350 of FIG. 3, or the example 3D NAND structure of FIGS. 4B-4D. However, process 600 is not limited to those examples.

Figure 7A:
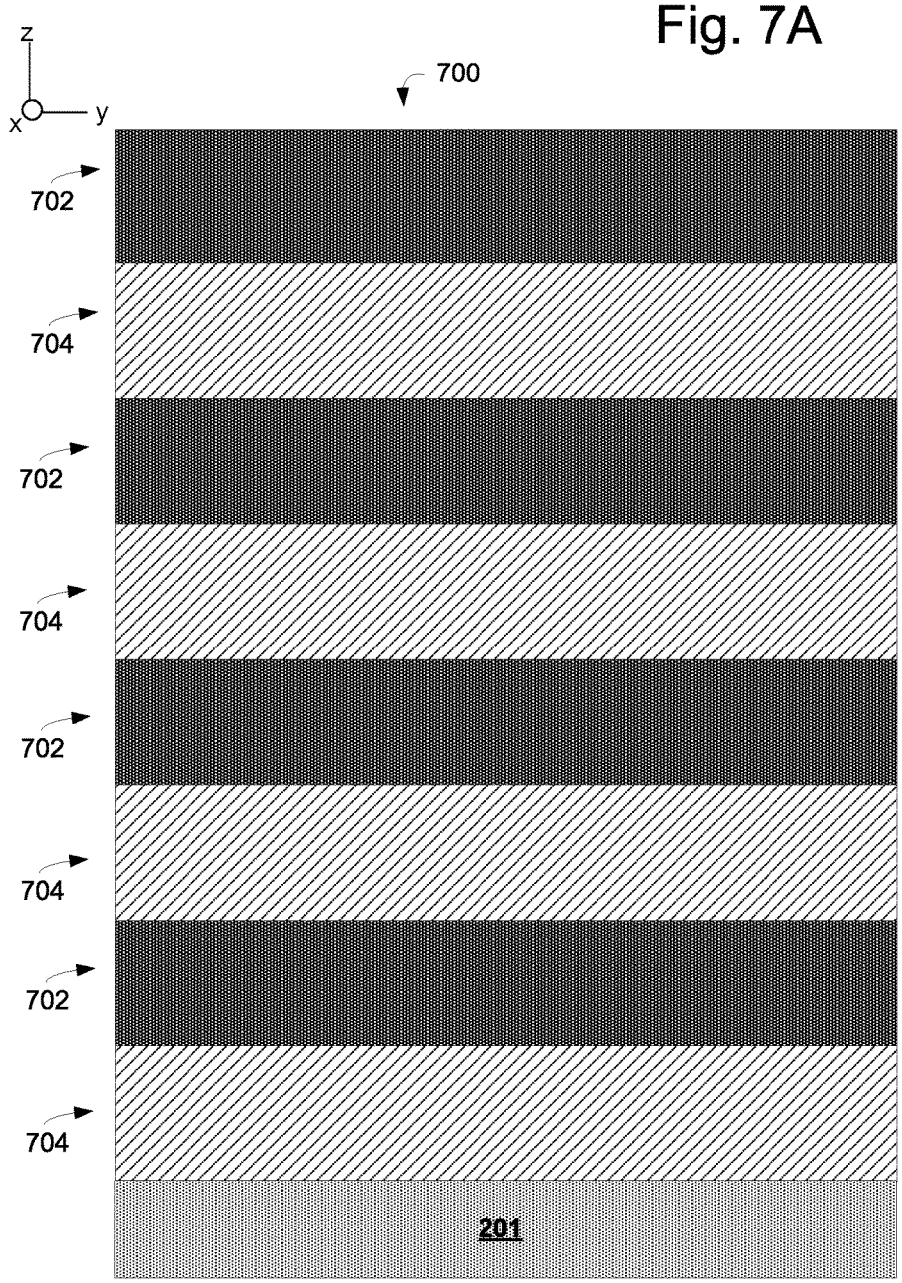

In step 602, an opening is formed through a stack of alternating layers of a first material and a second material. FIG. 7A depicts a stack 700 of alternating layers of a first material 702 and a second material 704 over a semiconductor substrate 201. In one embodiment, the first material 702 is a sacrificial material such as silicon nitride or polysilicon. In one embodiment, the second material 704 is silicon oxide. Silicon oxide for the second material 704 may be used with silicon nitride or polysilicon for the first material 702, but is not limited thereto. In one embodiment, the semiconductor substrate 201 has a major surface, above which the stack 700 is formed. The alternating layers of the first material 702 and the second material 704 extend horizontally with respect to the major surface of the semiconductor substrate, in one embodiment. In FIG. 7A, the alternating layers extend in the x-y plane.

FIG. 7B depicts results after one embodiment of step 602. An opening in the stack 700 is depicted. The opening extends down to the semiconductor substrate 201. The opening may be referred to as a memory hole (MH). The opening extends in the z-direction (or vertically with respect to the alternating layers). The opening has a vertical sidewall defined by the alternating layers of the first material 702 and the second material 704. The opening is cylindrical, in one embodiment. The horizontal cross section of the cylindrical opening may be, but is not limited to, circular, oval, or elliptical. The opening is not required to be cylindrical. For example, the opening could have a prismatic shape. A prismatic opening, as defined herein, has a horizontal cross section that is an n-sided polygon. A prismatic opening may have an n-sided polygonal base, another congruent base (with the same rotational orientation) and n other faces joining the two bases (the faces may be parallelograms). The value for "n" may be three or more. The diameter of the opening (cylindrical, prismatic, etc.) can vary somewhat from top to bottom of the stack. For example, it is possible for the opening to be more narrow at the bottom of the stack (the bottom being near the substrate 201).

Note that process 600 may be performed to form many openings in the stack 700 at the same time. In one embodiment, the openings are formed by using a mask. In the layout for the mask, there may be rectangles (or squares) for the openings. However, due to lithographic and processing effects, the horizontal cross section of the memory hole openings may end up being circular, or close to circular, in horizontal cross section. Thus, the opening (from top to bottom) is not necessarily a perfect cylinder or a perfect prism. For example, the horizontal cross section could have some portions that are a straight line (or very close thereto) and some portions that are an arc (or very close thereto). Thus, it will be understood that the various steps in process 600 that pertain to processing with respect to "an opening" may be performed in parallel for many openings in the stack, in one embodiment.

Figure 7C:
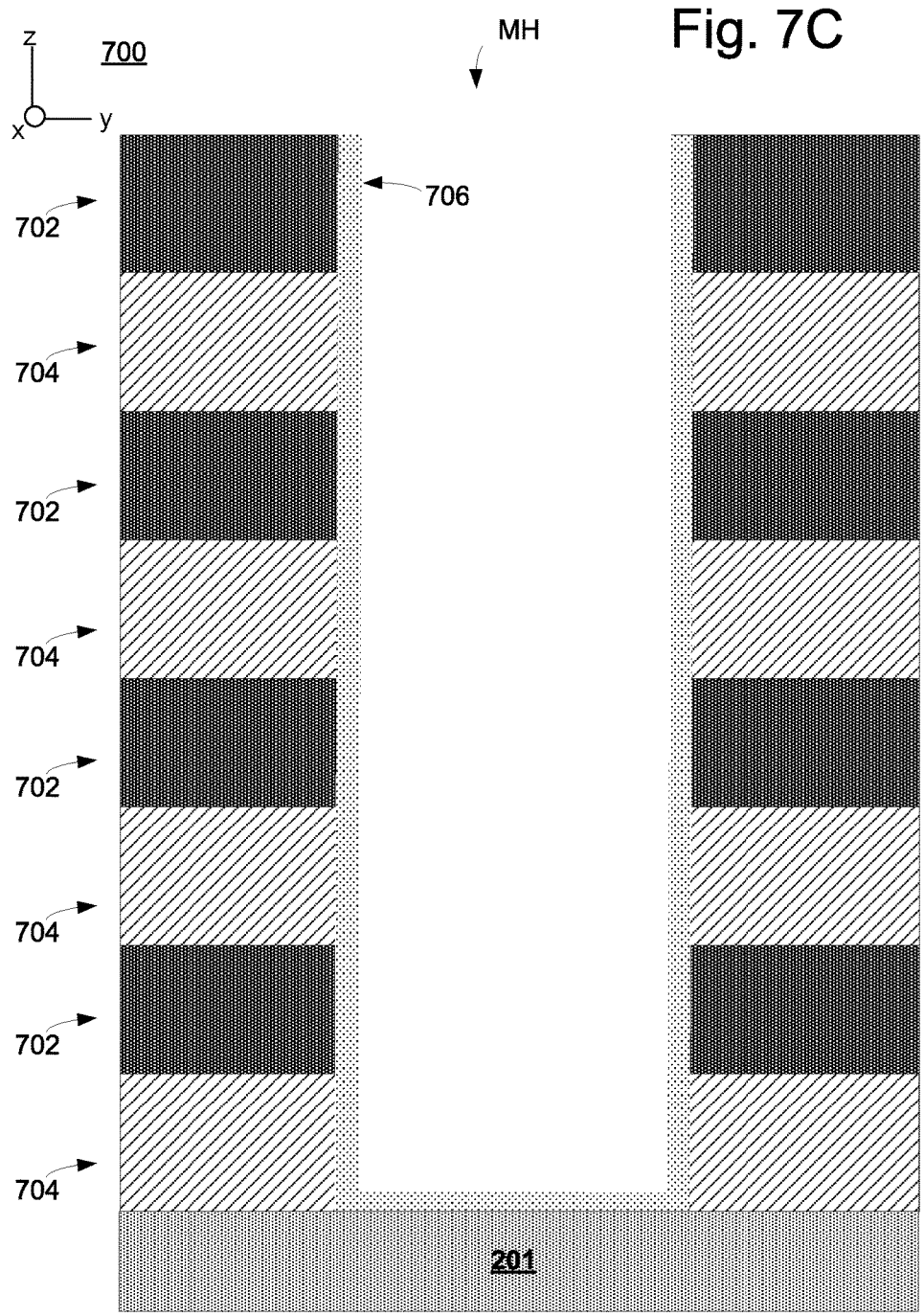

Step 604 includes forming a layer of silicon nitride on a sidewall of the opening. The silicon nitride can be formed, for example, by chemical vapor deposition (CVD), atomic layer deposition (ALD), physical vapor deposition (PVD), or any suitable deposition technique. FIG. 7C depicts results after one embodiment of step 604. The layer of silicon nitride 706 covers a vertical sidewall adjacent to the layers 702, 704, and also covers a previously exposed portion of the semiconductor substrate 201. The portion of the semiconductor substrate 201 may be described as being "at the bottom" of the memory hole. In one embodiment, the layer of silicon nitride is a conformal layer over the vertical sidewall of the opening (MH).

Step 606 includes removing silicon nitride in the opening that covers a semiconductor substrate 201 below the stack. In one embodiment, the silicon nitride is removed from the semiconductor substrate 201 using a reactive ion etch (RIE). Step 606 may include a directional RIE that primarily etches silicon nitride from the semiconductor substrate 201 without little or no removal of silicon nitride from the sidewalls of the MH.

FIG. 7D depicts results after one embodiment of step 606. FIG. 7D shows that the silicon nitride 706 has been removed from a portion of the semiconductor substrate 201. For example, silicon nitride 706 has been removed from the semiconductor substrate 201 at the bottom of the opening. However, the silicon nitride 706 remains in place on the vertical sidewall of the opening. Thus, the silicon nitride 706 remains as a protective layer over the first material 702 and the second material 704. Note that the semiconductor substrate 201 could have some oxide at the surface. For example, the semiconductor substrate 201 could a silicon substrate that has silicon oxide on the surface in the memory hole. A possible reason for the oxide is due to the process that etched through the stack 700 to form the opening. Another possible reason for the oxide is due to the process that removed the silicon nitride from the surface of the semiconductor substrate 201.

Step 608 includes cleaning a portion of the semiconductor substrate 201 that is exposed in the opening. Step 608 may include cleaning (or removing) oxide from the semiconductor substrate 201. In one embodiment, a dilute hydrofluoric acid (DHF) dip (or clean) is performed within the opening to clean the surface of the semiconductor substrate 201. For example, silicon oxide may be removed from the surface of a silicon semiconductor substrate. Note that the protective silicon nitride layer 706 is in place over the vertical sidewall of the opening during step 608. Hence, the first and second materials are protected. In one embodiment, the second material is silicon oxide. Therefore, this silicon oxide in the stack 700 is protected from undesired etching when cleaning (e.g., removing oxide from) the semiconductor substrate 201.

Figure 7E:
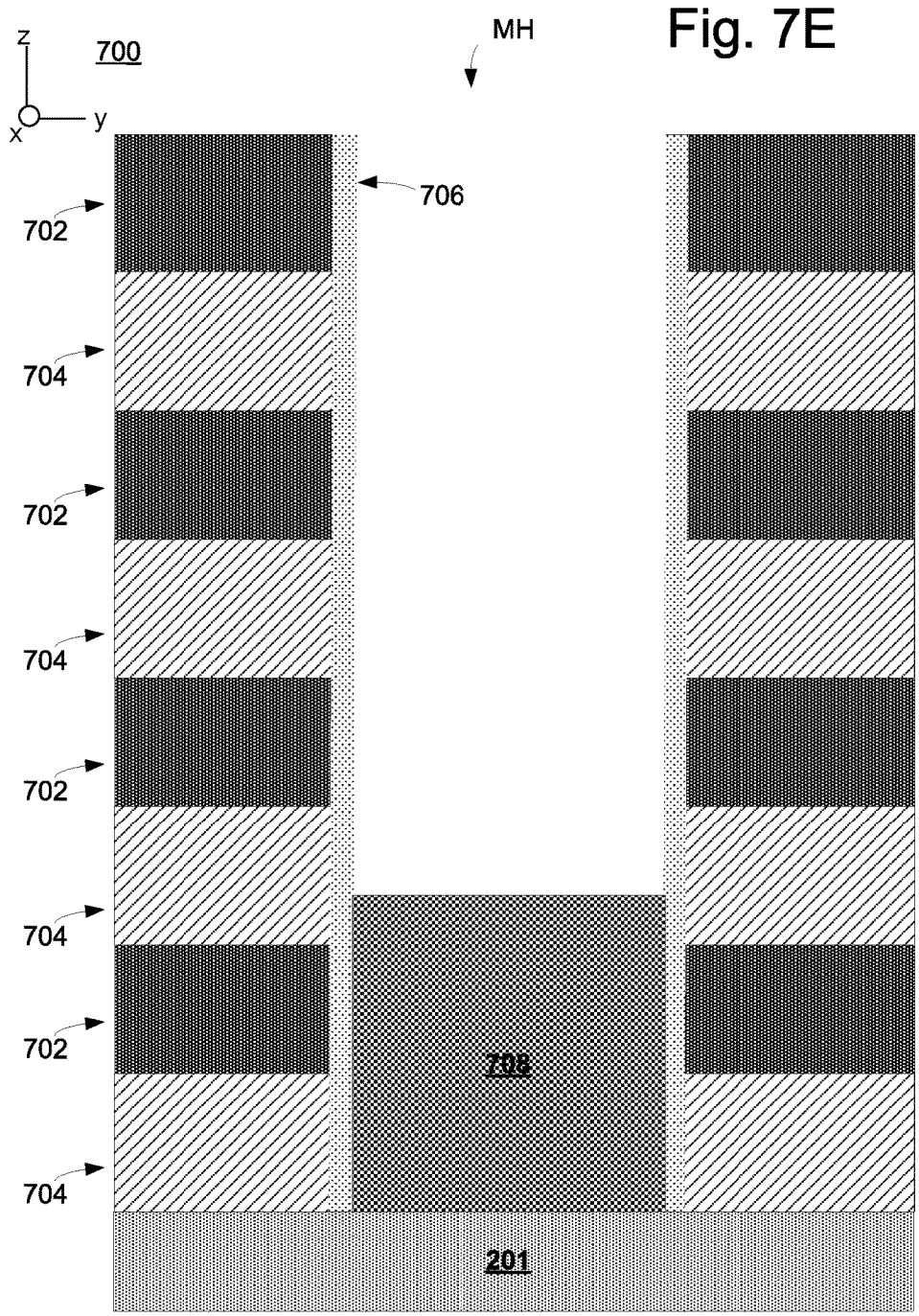

Step 610 includes forming a semiconductor in the opening and in contact with the semiconductor substrate 201. In one embodiment, the semiconductor will serve as a body for a select transistor of a string of memory cells that are formed in the opening. FIG. 7E depicts results after one embodiment of step 610. FIG. 7E depicts semiconductor region 708 in contact with the semiconductor substrate 201. In one embodiment, the semiconductor region 708 is in direct contact with the semiconductor substrate 201. By "in direct contact" it is meant that there are no intervening materials between the semiconductor region 708 and the semiconductor substrate 201.

In one embodiment, step 610 includes epitaxial growth, using the semiconductor substrate 201 as a crystalline substrate for epitaxial growth of the semiconductor region 708. Thus, the semiconductor region 708 may be crystalline semiconductor. In one embodiment, the semiconductor region 708 is single crystal semiconductor. In one embodiment, both the semiconductor substrate 201 and the semiconductor region 708 are crystalline silicon. However, both the semiconductor substrate 201 and the semiconductor region 708 could be a crystalline semiconductor other than silicon.

It is not required that semiconductor region 708 be single crystalline semiconductor. Nor is it required that semiconductor region 708 be formed using epitaxial growth. For example, semiconductor region 708 might be amorphous semiconductor, as deposited. A thermal anneal may be used at some point to form polycrystalline semiconductor from the amorphous semiconductor.

It is not required that the semiconductor region 708 and the semiconductor substrate 201 be the same material. For example, semiconductor substrate 201 might be silicon and semiconductor region 708 might be a semiconductor other than silicon such as, for example, germanium or a III-V semiconductor.

Step 612 includes converting at least a portion of the silicon nitride 706 to an oxide. The oxide could include, but is not limited to, silicon oxide. Step 612 may include converting an exposed portion of the layer of silicon nitride in the opening to an oxide, in one embodiment. The "exposed portion" of the layer of silicon nitride 706 refers to the portion of silicon nitride 706 in the opening that is not covered by the semiconductor region 708. In one embodiment, at least some of the exposed portion of the silicon nitride 706 in the opening is converted to silicon oxide. In one embodiment, substantially the entire exposed portion of the silicon nitride 706 in the opening is converted to silicon oxide. Note that it is possible for some silicon nitride 706 to remain unconverted. For example, depending on the time, temperature, reactants, and possibly other factors, some of the silicon nitride 706 that is closest to the stack might remain silicon nitride. However, process conditions may be established such that substantially all of the silicon nitride 706 that is exposed to reactants in step 612 is converted to an oxide, such as silicon oxide.

In one embodiment, step 612 comprises a wet oxidation process. In one embodiment, step 612 comprises introducing a mixture of oxygen and a halogen into the opening. In one embodiment, step 612 comprises introducing a mixture of an oxygen reactant and a fluorine-containing compound into the opening. The temperature when introducing the oxygen and a halogen is at least 500 degrees Celsius, in one embodiment. The temperature when introducing the oxygen and a halogen is at least 600 degrees Celsius, in one embodiment. The temperature when introducing the oxygen and a halogen is at least 700 degrees Celsius, in one embodiment. A higher temperature may speed the rate of oxidation of the exposed silicon nitride.

It is not required that all of the exposed silicon nitride 706 in the opening be converted to silicon oxide. In one embodiment, at least a portion of the exposed silicon nitride 706 in the opening is converted to silicon oxynitride.

Figure 7F:
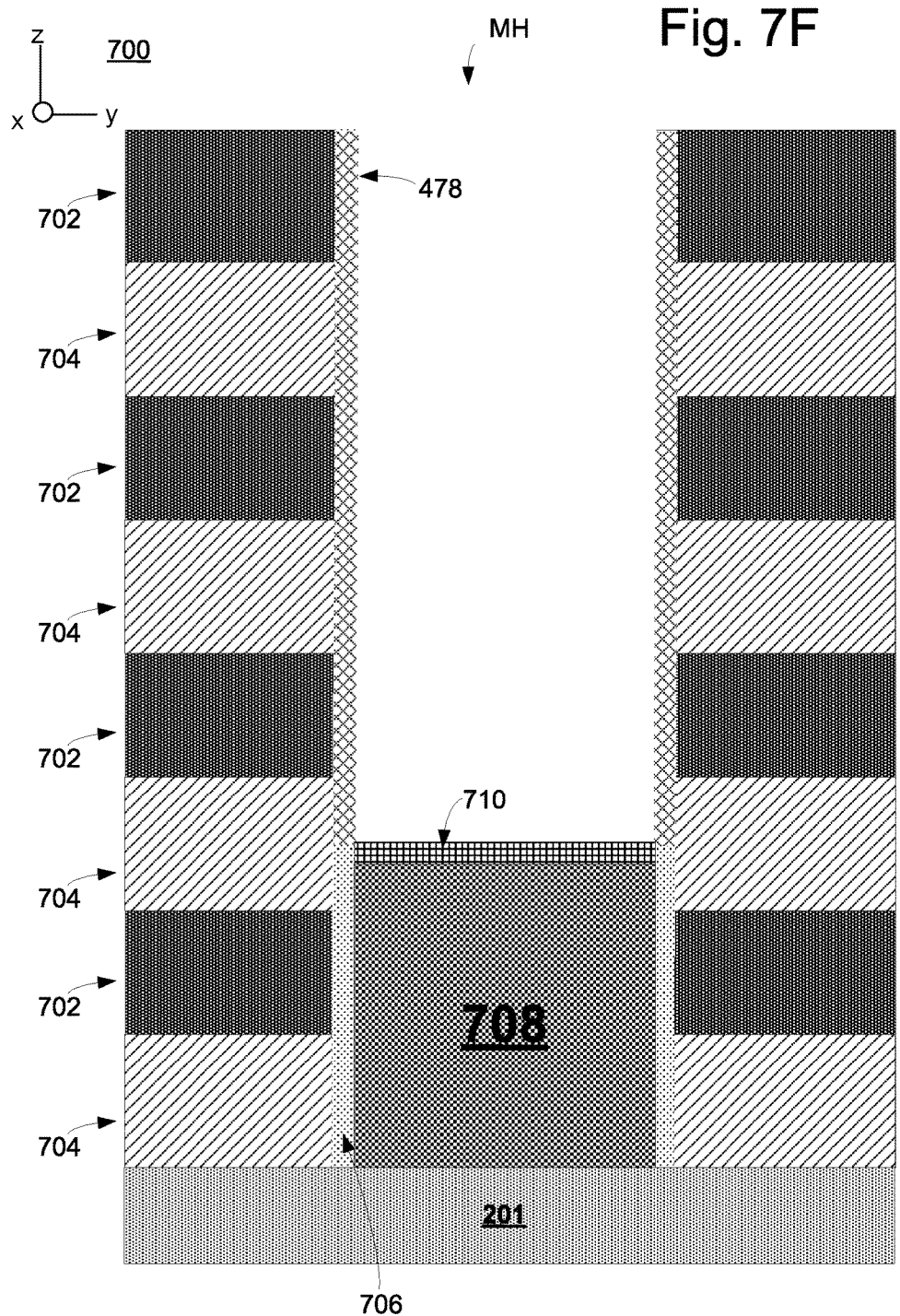

FIG. 7F depicts results after one embodiment of step 612. A portion of the silicon nitride has been converted to an oxide 478, in this embodiment. In this example, the exposed portion of the silicon nitride has been converted to an oxide 478. Note that the oxide 478 may serve as a blocking layer between control gates and charge storage regions of memory cells (which will be formed later), in one embodiment. For example, silicon nitride 706 that was exposed on the vertical sidewall of the opening may be converted to, for example, silicon oxide, silicon oxynitride, a combination of silicon oxide and silicon oxynitride, etc. Also, some oxide 710 has been formed on the exposed surface of semiconductor region 708. The oxide 710 on the semiconductor region 708 may be semiconductor oxide. For example, if semiconductor region 708 is silicon, then oxide 710 may be silicon oxide. Note that a portion of the silicon nitride layer 706 that is not exposed to the mixture of reactants may remain as silicon nitride. In FIG. 7F, a portion of the silicon nitride layer 706 that is adjacent to a sidewall of the semiconductor region 708 is not exposed to the mixture of reactants, and is not converted to oxide.

Step 614 includes forming a memory cell film in the opening. In one embodiment, a string of at least parts of memory cells are formed in the opening. For example, a string channel (e.g., NAND string channel) and a charge storage film (or layer) for charge storage regions for a string of memory cells may be formed in the opening. In one embodiment, the charge storage film is a dielectric charge film that serves as dielectric charge regions of memory cells. In one embodiment, the charge storage film is a conductive film that serves as conductive floating gates of memory cells. The memory cell film may also comprise a tunnel dielectric film (or layer) between the charge storage film and the string channel.

Figure 7G:
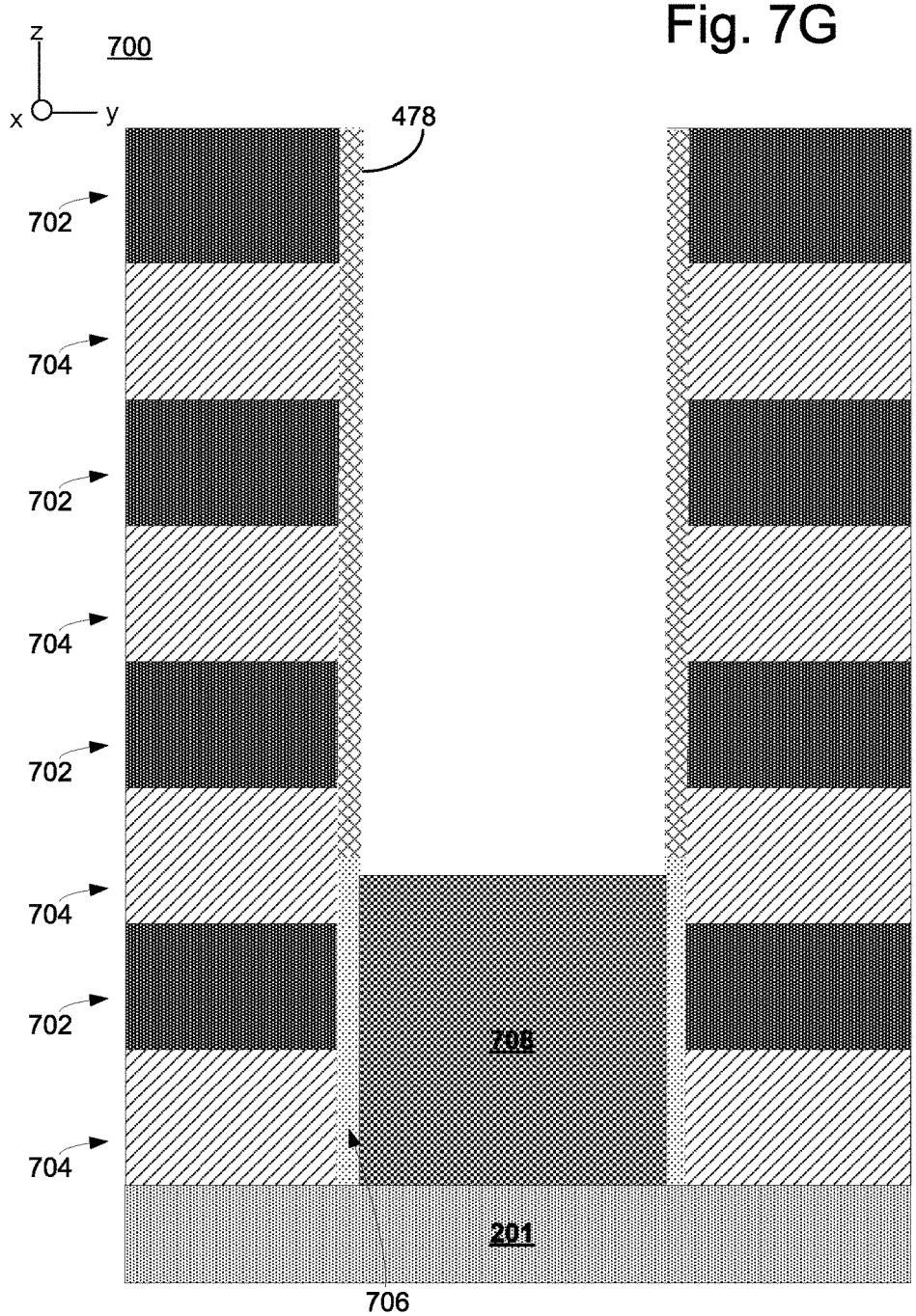

Step 614 may include removing oxide 710 from the semiconductor region 708. In one embodiment, a reactive ion etch (RIE) is used to remove the oxide 710 from the semiconductor region 708. Step 614 may include an anisotropic etch process to etch the oxide 710. Step 614 may include an isotropic etch process to etch the oxide 710. FIG. 7G depicts results after removing oxide 710 from the semiconductor region 708. Optionally, removing the oxide from the semiconductor region 708 may wait until after forming various layers for a memory cell film.

Figure 7H:
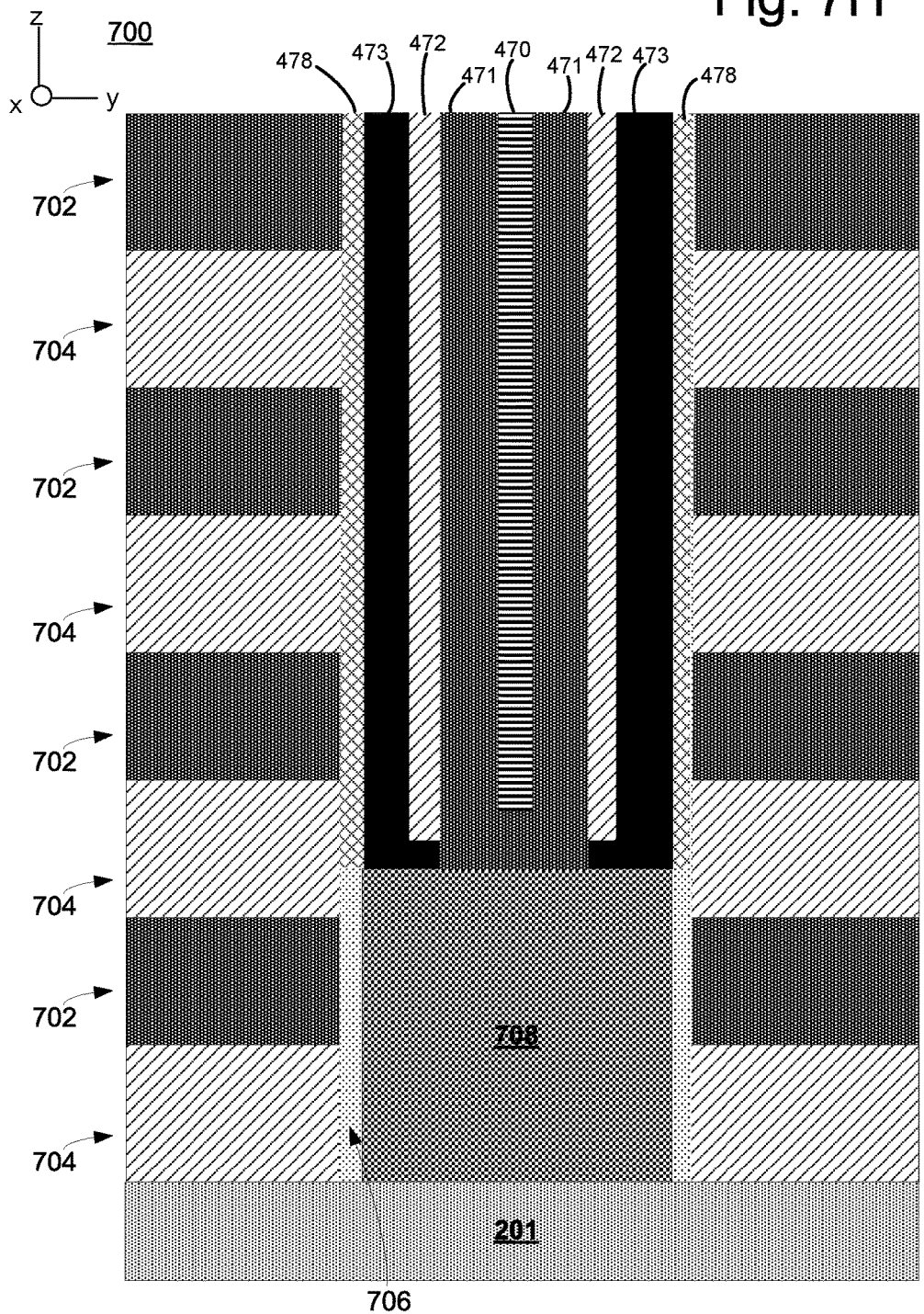

Step 614 may also include forming various layers for a memory cell film. Note that "forming layers for a memory cell film" does not require that all layers of the memory cell film be formed in step 614. FIG. 7H depicts results after one embodiment of step 614. In this example, the memory cell film comprises, channel 471, tunneling dielectric 472, charge trapping layer 473, and oxide layer (e.g., silicon oxide, silicon oxynitride, etc.) 478. The memory cell film could comprise different layers of material. The memory cell film has a straight, or nearly straight, contour in the z-direction. This prevents or reduces charges from becoming trapped in charge trapping layer 473. Moreover, neighbor word line interference is prevented or reduced. Note that the silicon nitride may be replaced by conductive material for word lines (or control gates).

In general, forming various layers for a memory cell film may comprise depositing successive layers of materials. Further details of one embodiment of forming various layers for a memory cell film are described in connection with FIG. 8.

Step 616 includes forming control gates for memory cells. In one embodiment, step 606 comprises replacing the first material 702 with a conductive material for the control gates. Step 616 may also include forming a gate oxide on the semiconductor region 708.

Figure 7I:
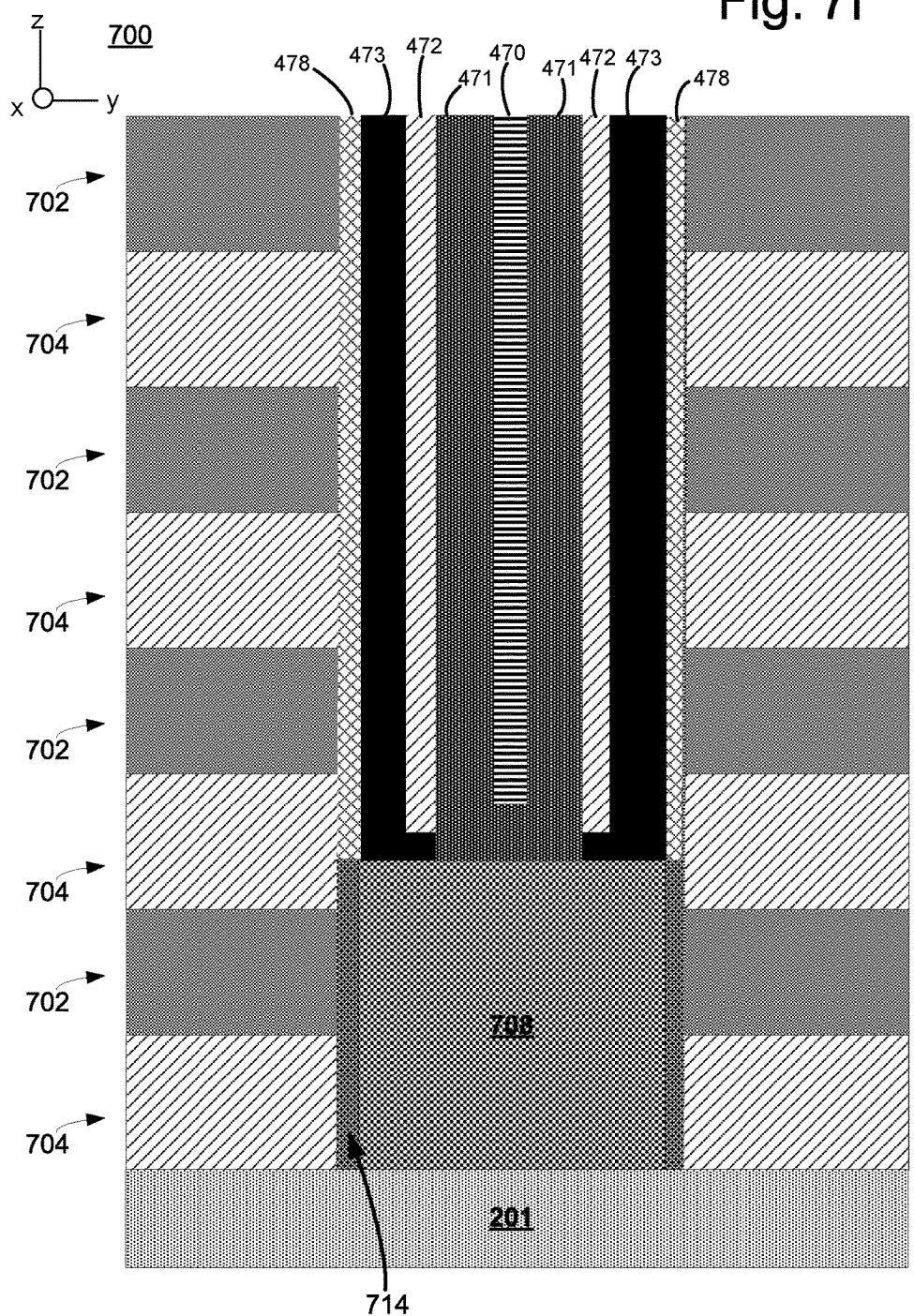

FIG. 7I depicts results after one embodiment of step 616. The first material 702 has been replaced by conductive material 712 for the control gates. The silicon nitride that was adjacent to the semiconductor region 708 has been removed. Oxide 714 has been formed where the silicon nitride was removed from. The oxide 714 may be a semiconductor oxide formed from a surface region of semiconductor region 708. For example, if semiconductor region 708 is silicon, then oxide 714 may be silicon oxide.

After process 600, other steps such as forming a bit line and a bit line contact to the string channel may be performed.

Figure 8:
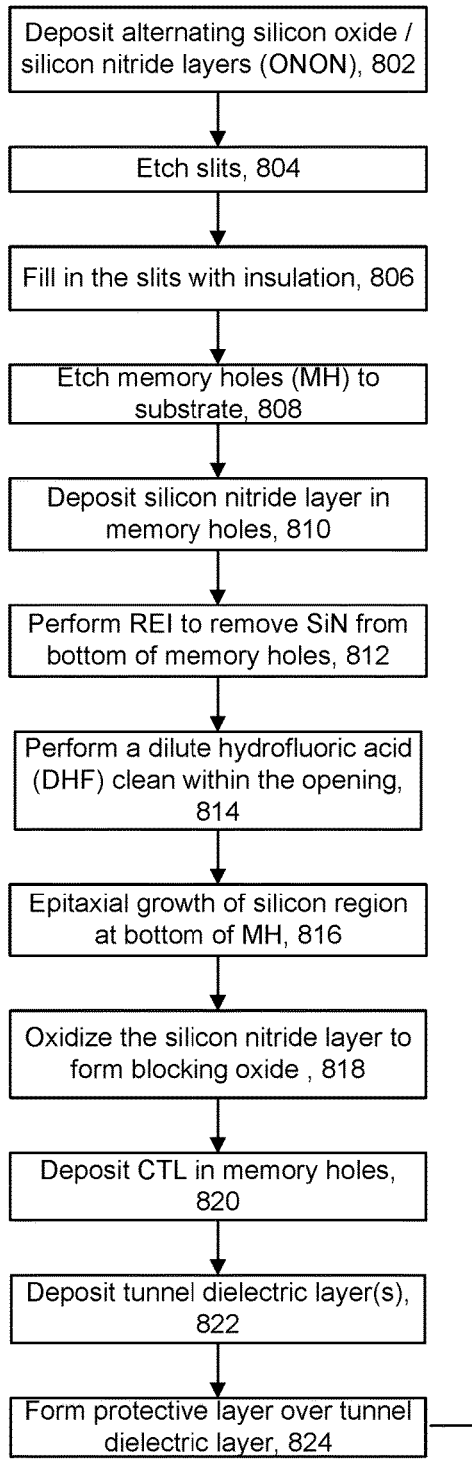
FIG. 8 is a flowchart of one embodiment of a process 800 of forming memory cell film in memory holes in a stack of alternating layers of silicon oxide and silicon nitride.
Figure 8:
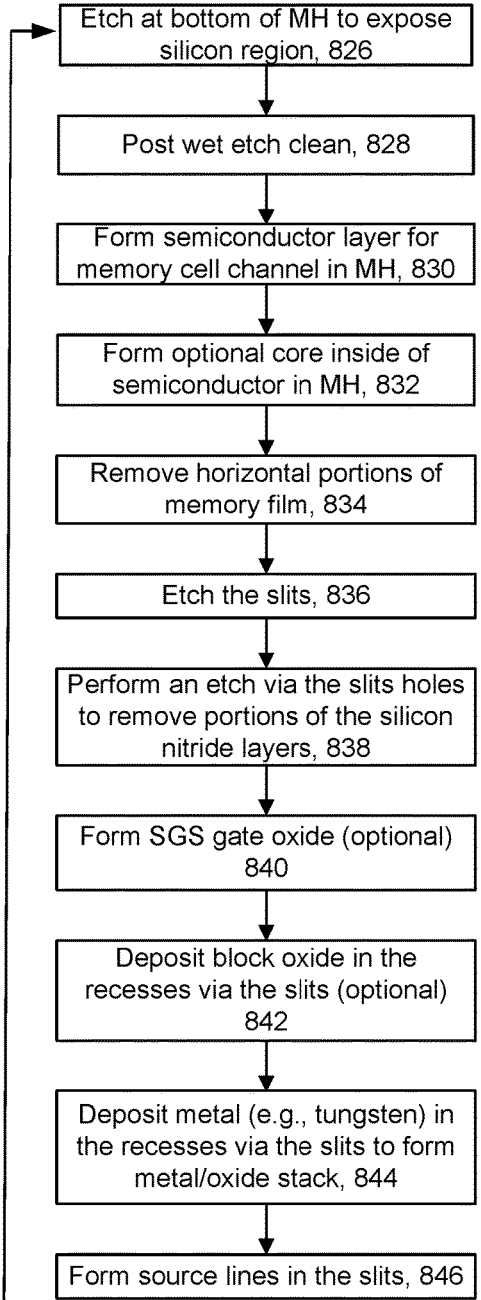

FIG. 8 is a flowchart of one embodiment of a process 800 of forming a memory cell film in memory holes in a stack of alternating layers of silicon oxide and silicon nitride. The process 800 provides further details of one embodiment of the process 600 of FIG. 6. FIGS. 9A-9J depict results after various steps of process 800 of FIG. 8. FIGS. 9A-9J depict an example similar to the embodiment of FIG. 4C. In process 800, the memory cell film may be used to form NAND strings. The process 800 could be adapted to form other types of memory cells having a memory cell film formed in a memory hole.

In FIG. 8, steps need not necessarily be performed as discrete steps in the order indicated. Various modifications can be made. Moreover, other steps which are known from the art of semiconductor fabrication but are not explicitly depicted here may also be performed. FIG. 8 represents a "word line last" technique in which the word lines are formed after forming the NAND strings. For example, after forming the NAND strings, sacrificial silicon nitride may be replaced, at least in part, with metal.

Prior to process 800, below-stack circuitry and metal layers may be formed in the substrate 201. Various circuits may be formed in the semiconductor substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance. Note that it is not required to form circuits in the substrate 201. Also, at least some of the circuits can be formed over top of the array after process 800 is complete. For example, the aforementioned metal layers M0, M1 and optionally, M2 can be formed over the memory array.

Step 802 includes depositing alternating silicon oxide (e.g., $SiO_2$)/silicon nitride (e.g., SiN) layers above the semiconductor substrate 201. The silicon nitride is a sacrificial layer, which will be replaced at least in part by metal to form word lines (as well as a source select line (SGS), and a drain select line (SGD or SG). A portion of the blocking layer (e.g., FIG. 4D, 477) may be formed adjacent to the word lines. The silicon oxide will be used for the insulating layers between the metal word (and select) lines. Other insulators could be used instead of silicon oxide. Other sacrificial materials could be used instead of silicon nitride. In one embodiment, the sacrificial material is polysilicon.

Step 804 includes etching slits in the alternating silicon oxide ($SiO_2$)/silicon nitride (SiN) layers. Step 806 includes filling in the slits with insulation. Note that later in process 800 at least a portion of this insulation will be removed. These slits may eventually be used as the second openings referred to in process 800. Thus, these slits can have a shape similar to the local source lines 344 depicted in FIG. 3. Note that such slits could extend for the entire length of a block.

Step 808 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) (70-110×10$^{-9}$ meters). This is an example range; other ranges could be used. Also note that the diameter could vary from top to bottom. Step 808 is one embodiment of step 602 from process 600 of FIG. 6.

FIG. 9A shows results after one embodiment of step 808. FIG. 9A shows sacrificial layers (SAC0-SAC6 and SAC 56) alternating with insulating layers (DL0-DL7 and DL57) in a stack 900 over a semiconductor substrate 201. There may be more or fewer layers than in this example. Sacrificial layers SAC7 through SAC55 are not depicted in FIG. 9A. Insulating layers DL8 through DL56 are not depicted in FIG. 9A. FIG. 9A is consistent with formation of the device of FIG. 4C, which shows two memory holes 432, 434, and two source lines 344*b*, 344*c*. The two vertical memory holes (MH) in FIG. 9A correspond to memory holes 432, 434. In FIG. 9A, regions 902*a*, 902*b* are where insulation has been used to fill the slits. The source lines 344*b*, 344*c* will eventually be formed in regions 902*a*, 902*b*.

The sacrificial layers are silicon nitride (SiN) in this embodiment and will eventually be layers SGS, DWLL2*a*, DWWL2*b*, WLL0-WLL47, DWLL1*b*, DWWL2*a*, SGD3, SGD2, SGD1, and SGD0 (note that the aluminum oxide layer 477 may also be formed in the region vacated by the sacrificial layers in one embodiment). The insulating layers are silicon oxide in this embodiment. The two memory holes (MH) are depicted as extending vertically through the alternating sacrificial layers and insulating layers. The memory holes extend down to the semiconductor substrate 201, which is formed from silicon in one embodiment. Etching the memory holes could etch partway into the semiconductor substrate 201. An x-y-z coordinate system is depicted, showing the direction of formation. The memory holes each have a major axis that is parallel to the z-axis.

Figure 9B:
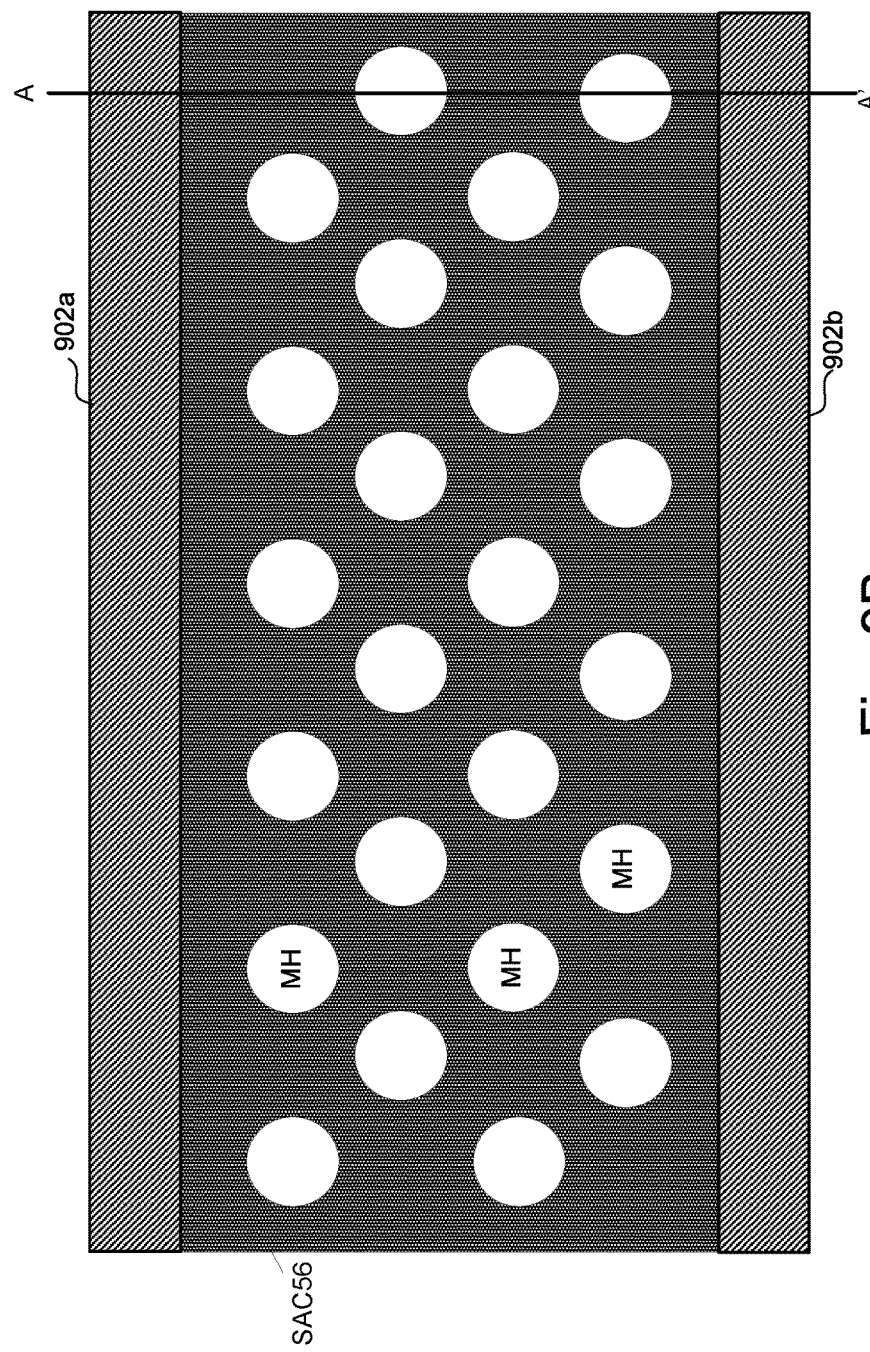

FIG. 9B shows a cross sectional view of sacrificial layer SAC56 from FIG. 9A after step 808, showing one possible pattern for the memory holes (MH). This is not the only possible pattern. For example, the memory holes do not need to be staggered as depicted. An x-y-z coordinate system is depicted, showing the direction of formation. Note that line A-A' indicates that FIG. 9A is a cross section along line A-A' of FIG. 9B. Also note that the memory holes have a circular cross section in the horizontal direction (e.g., x-y plane), in this example. The memory holes are not required to be circular in horizontal cross section. Note that the memory holes could be of different diameter in the different layers. For example, the memory holes could have a smaller diameter at the lower layers. FIG. 9B shows that the insulation filled slits 902*a*, 902*b* extend in the x-direction.

Figure 9C:
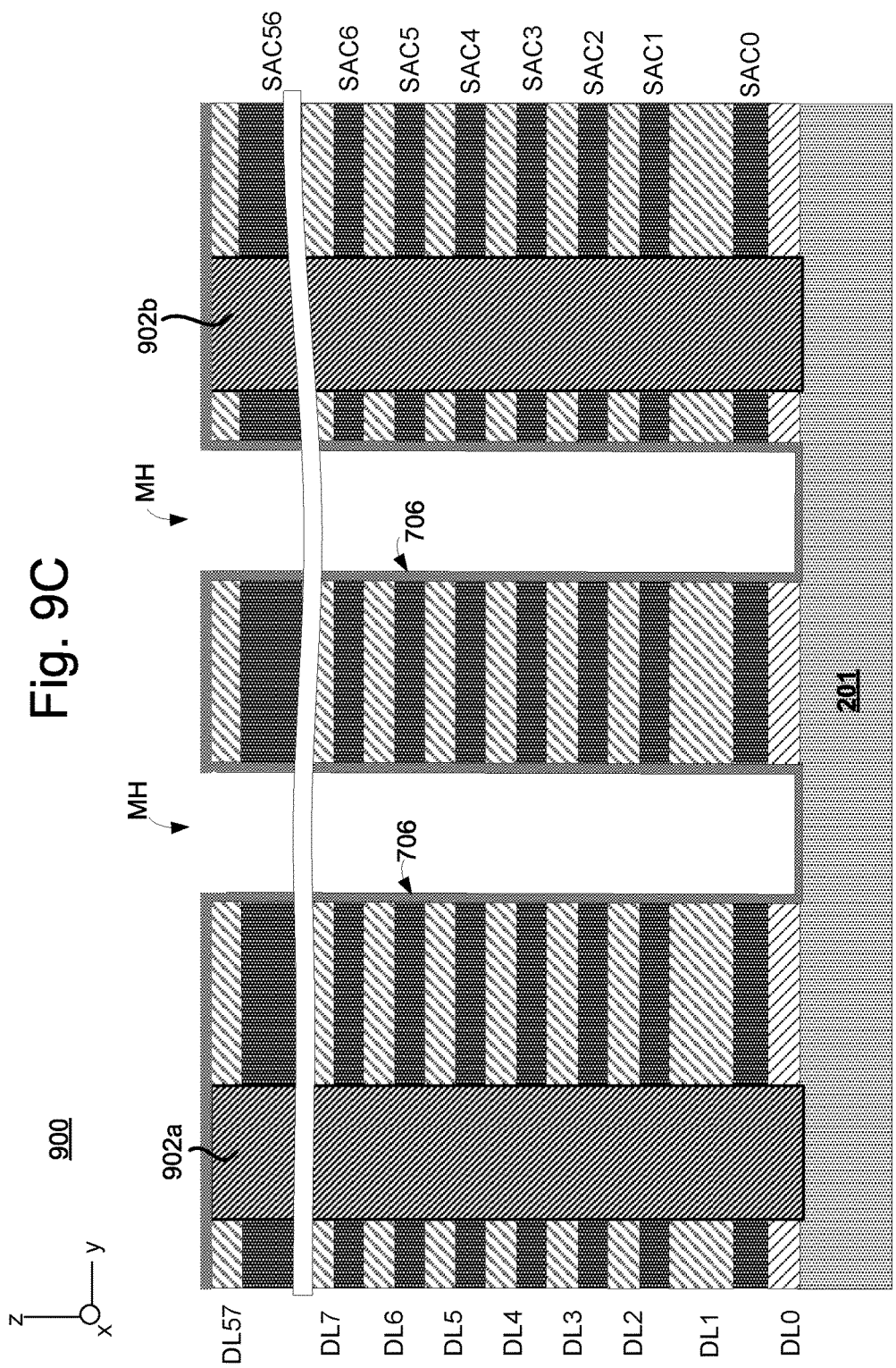

Step 810 is to deposit a layer of silicon nitride into each of the memory holes. Step 810 is one embodiment of step 604 from process 600. The silicon nitride can be formed, for example, by chemical vapor deposition (CVD), atomic layer deposition (ALD), physical vapor deposition (PVD), or any suitable deposition technique. FIG. 9C depicts results after one embodiment of step 810. FIG. 9C shows layer of silicon nitride 706 on the vertical sidewall of each memory hole. The layer of silicon nitride 706 also covers a previously exposed portion of the semiconductor substrate 201. The layer of silicon nitride 706 covers a top of the stack 900 outside of the memory holes, but this is not a requirement.

Figure 9D:
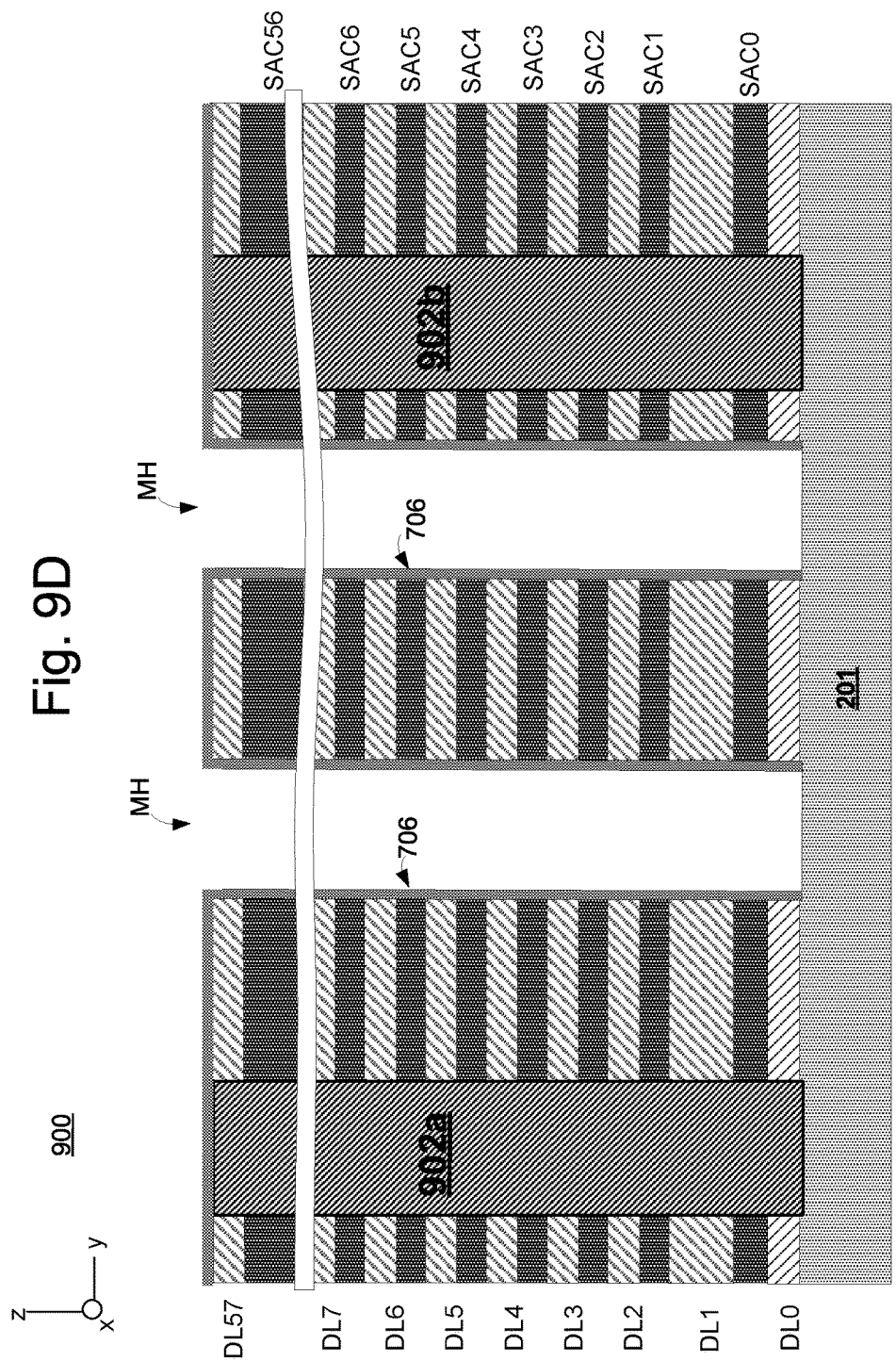

Step 812 is a reactive ion etch (RIE) to remove silicon nitride from bottoms of the memory holes. In one embodiment, the silicon nitride is removed from the semiconductor substrate 201 using a reactive ion etch (RIE). FIG. 9D depicts results after one embodiment of step 812. Step 812 is one embodiment of step 606 from process 600. FIG. 9D shows that the silicon nitride 706 has been removed from a portion of the semiconductor substrate 201. For example, silicon nitride has been removed from the semiconductor substrate 201 at the bottom of the opening.

Step 814 is a DHF clean (also referred to as "pre-clean"). Step 814 prepares the surface of the semiconductor substrate 201 for epitaxial growth. Step 814 may include cleaning (or removing) oxide from the semiconductor substrate 201. For example, silicon oxide may be removed from the surface of a silicon semiconductor substrate. Note that the protective silicon nitride layer 706 is in place over the vertical sidewall of the memory holes during step 814. Hence, the silicon oxide and silicon nitride layers in the stack 900 are protected. Therefore, the silicon oxide layers are protected from undesired etching when removing oxide from the semiconductor substrate 201, in one embodiment.

Figure 9E:
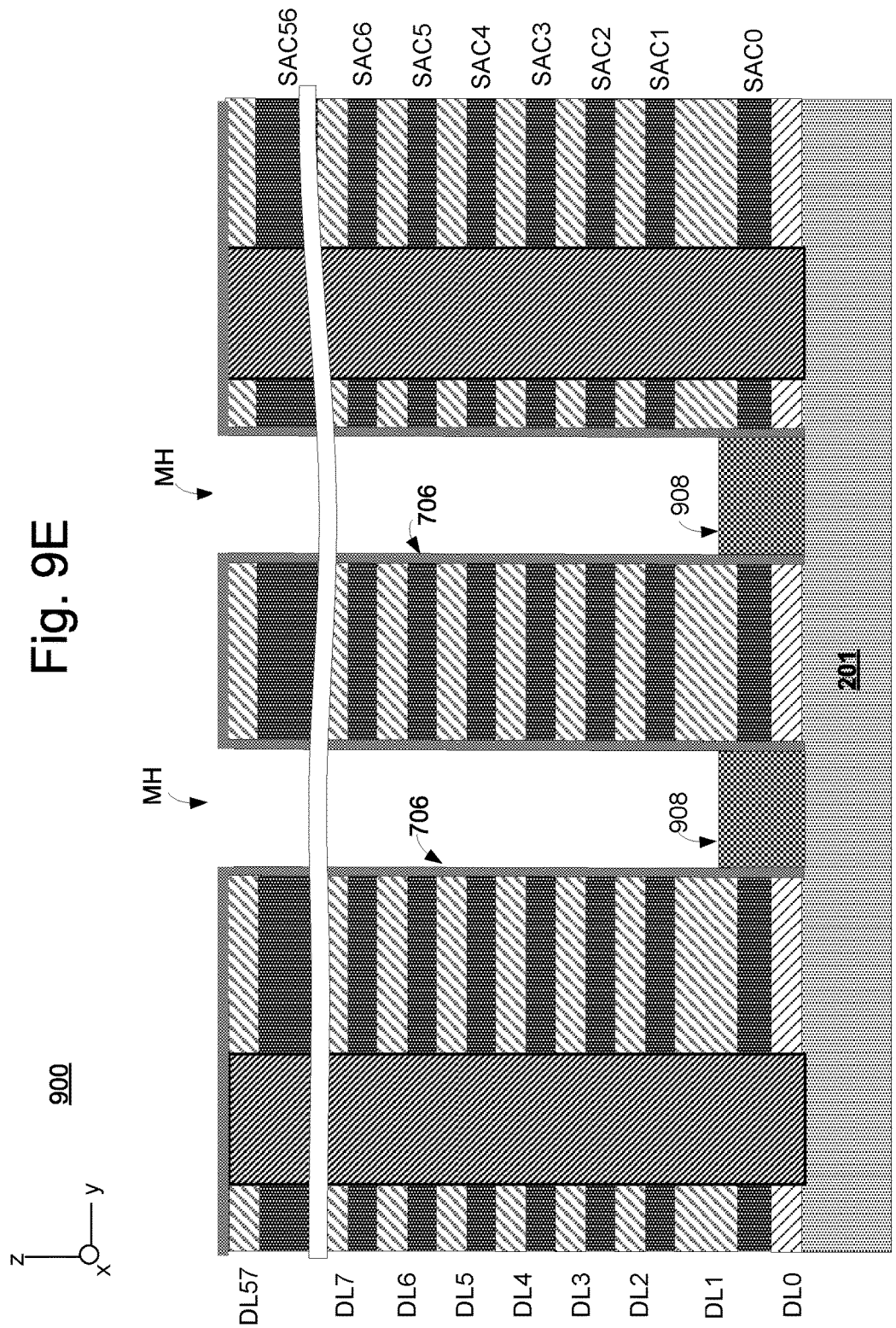

Step 816 includes epitaxial growth of crystalline silicon using the semiconductor substrate 201 as a crystalline substrate. Step 816 is one embodiment of step 610 from process 600. FIG. 9E depicts results after step 816, showing silicon region 506 in the bottom of the memory holes (MH). Note that silicon region 908 will serve as the body of the source side select transistor. The silicon region 908 may cover the vertical sidewalls of the memory holes near the bottom (e.g., at DL0, sacrificial layer SAC0, and part of DL1). The silicon region 908 is in direct contact with the substrate 201, in the embodiment. Note that step 816 could form a semiconductor other than silicon for the bodies.

Step 818 includes oxidation of at least a portion of the silicon nitride layer 706 to form a blocking layer. Step 818 is one embodiment of step 612 from process 600. In one embodiment, step 818 comprises introducing a mixture of oxygen and a halogen into the memory holes. In one embodiment, step 818 comprises introducing a mixture of an oxygen reactant and a fluorine-containing compound into the memory holes. The temperature is at least 500 degrees Celsius, in one embodiment. The temperature is at least 600 degrees Celsius, in one embodiment. The temperature is at least 700 degrees Celsius, in one embodiment. A higher temperature may speed the rate of oxidation of the exposed silicon nitride. It is not required that all of the exposed silicon nitride 706 in the memory holes be converted to silicon oxide. In one embodiment, at least a portion of the exposed silicon nitride 706 in the memory holes is converted to silicon oxynitride.

FIG. 9F depicts results after one embodiment of step 818. The portions of the silicon nitride layer 706 that were converted to oxide are labeled as 478. Some oxide is also depicted on the silicon region 908. This oxide may be silicon oxide that may result from oxidizing a surface region of silicon region 908 during step 818. Unconverted portions of the silicon nitride layer 706 are depicted adjacent to the sidewall of each silicon region 908.

Step 820 is depositing the charge trapping layer (CTL) 473 in the memory holes. In one embodiment, a nitride such as SiN be deposited as a charge trapping layer 473. This may be deposited as a conformal layer over the blocking layer 478. The charge trapping layer may cover the blocking layer 478 on vertical sidewalls, as well as oxide on the surface of the silicon region 908. The charge trapping layer 473 can be formed, for example, by chemical vapor deposition (CVD), atomic layer deposition (ALD), physical vapor deposition (PVD), or any suitable deposition technique.

Step 822 is depositing at least one of the layers of the tunnel dielectric 472 in the memory holes. The tunnel dielectric 472 may be deposited as a conformal layer on the charge trapping layer 473. Thus, the tunnel dielectric 472 may cover vertical sidewalls of the charge trapping layer 473, as well as the portion of the charge trapping layer 473 that is on the silicon region 908. The tunnel dielectric 472 can be formed, for example, by chemical vapor deposition (CVD), atomic layer deposition (ALD), physical vapor deposition (PVD), or any suitable deposition technique.

Step 822 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Step 824 is to deposit a protective layer over the tunnel dielectric layers. In one embodiment, a layer of silicon oxide is deposited. This may be deposited using CVD or ALD, as two examples. The silicon oxide may be about 5 nm in thickness. However, it could be thicker or thinner. The protective layer may serve to protect the tunnel dielectric during later etching steps.

Step 826 includes etching at the bottom of the memory holes to expose the silicon regions 908. In one embodiment, this is a reactive ion etch (RIE). Step 826 may include one or more anisotropic etch processes to sequentially etched various layers. The etch may include zero or more isotropic etch processes and zero or more anisotropic etch processes.

Step 828 is a post wet etch clean. This step removes the protective layer (from step 824). In one embodiment, a wet etch is used to remove the silicon oxide protective layer. Also polymer residues from the etch of step 826 are etched away.

FIG. 9G shows results after step 828. The etching has created a gap in the memory film at the bottom of the memory holes to expose the top of silicon region 908. The etching has gone through the horizontal portion of tunnel dielectric layer(s) 472, through horizontal portion of the charge trapping layer 473, and through horizontal portion of the oxide at the bottom of the memory holes.

Step 830 is to form a semiconductor layer in the memory holes for the semiconductor channel of the memory cells. The semiconductor layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor layer includes amorphous silicon or polysilicon. The semiconductor layer can be formed by a conformal deposition method such as low pressure chemical vapor deposition (LPCVD). The thickness of the semiconductor layer can be in a range from 2 nm to 101 nm, although lesser and greater thicknesses can also be employed. The semiconductor layer may partially fill the cavity in each memory opening, or may fully fill the cavity in each memory opening.

Step 832 is an optional step of forming a dielectric core inside of the semiconductor channel. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Certain of the steps of process 800 form a memory cell film in the memory holes. For example, steps 820, 822, 830 are one embodiment of forming at least a portion of a memory cell film in memory holes. Forming a memory cell film is not limited to steps 820, 822, 830.

Figure 9H:
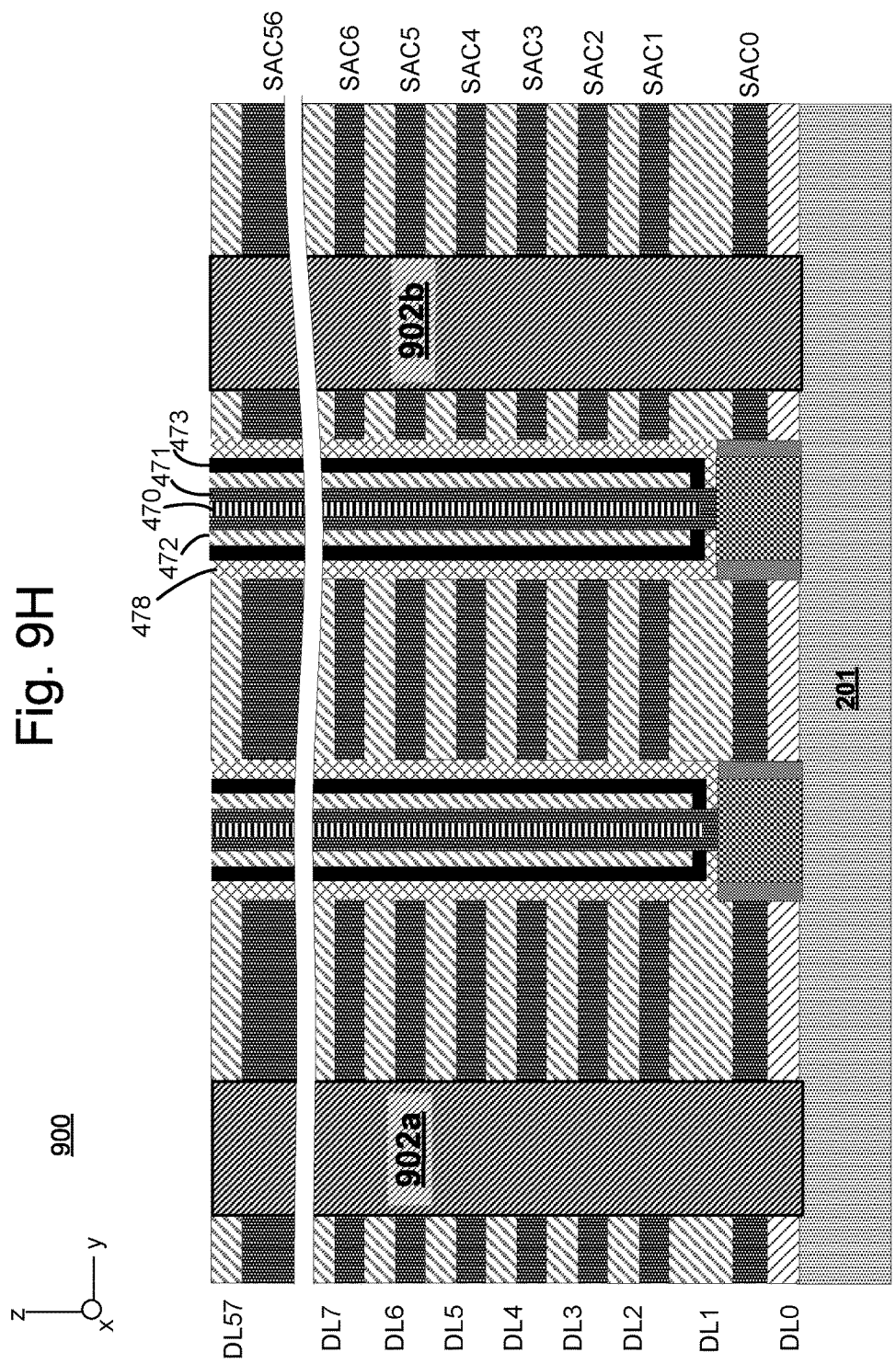

Step 834 is to remove a portion of the memory cell film outside of the memory holes. The horizontal portion of various layers can be removed, for example, by a recess etch or a chemical mechanical planarization (CMP). Optionally, an n-type dopant can be implanted in the drain end of the semiconductor channel. This creates an n+ region at the drain end that reduces contact resistance with a bit line contact, in one embodiment. FIG. 9H depicts results after step 834. FIG. 9H shows the addition of the semiconductor channel 471 and optional core dielectric 470 in the memory holes.

Step 836 is to etch the slits 902. This removes the material that was in the slits and is done to allow removal of the sacrificial silicon nitride and to deposit metal.

Step 838 includes performing an etch via the slits to remove portions of the silicon nitride layers in the stack 900. Step 838 also removes a portion of the silicon nitride that was deposited in step 810, but not converted to oxide in step 818.

The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

Figure 9I:
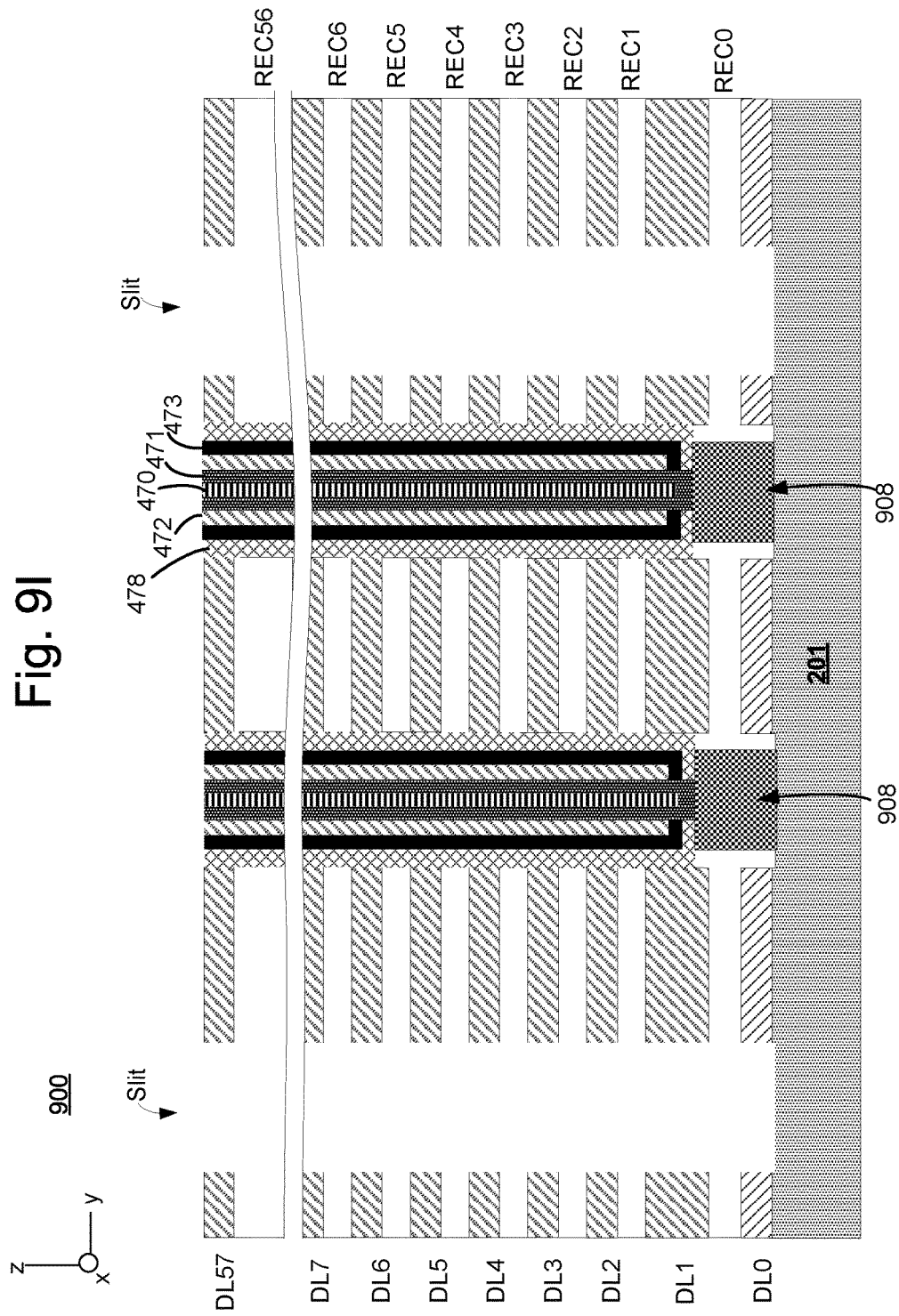

FIG. 9I depicts results after one embodiment of step 838. Recesses (REC0-REC6, REC56) are shown where sacrificial layers SAC0-SAC6 and SAC56 were. Also note that the unconverted portion of the silicon nitride layer 706 that was adjacent to the sidewalls of the silicon region 908 has been removed.

Step 840 is an optional step of forming a gate oxide for the source side select transistors. Step 840 may include oxidation of sidewalls of the silicon region 908 to form gate oxides.

In optional step 842, a portion of the blocking layer is formed in the recesses. This portion of the blocking layer is an $Al_2O_3$ layer, in one embodiment. This portion of blocking layer may be deposited by ALD from outside of the memory hole through the slits.

Step 844 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Step 846 is forming material in the slits for the local source lines (also referred to as local interconnects). Step 846 may include depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment. Step 846 may include depositing one or more conductive fill materials in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). Step 846 may also include one or more etching steps to remove excess fill material (for both the first and second fill material).

Figure 9J:
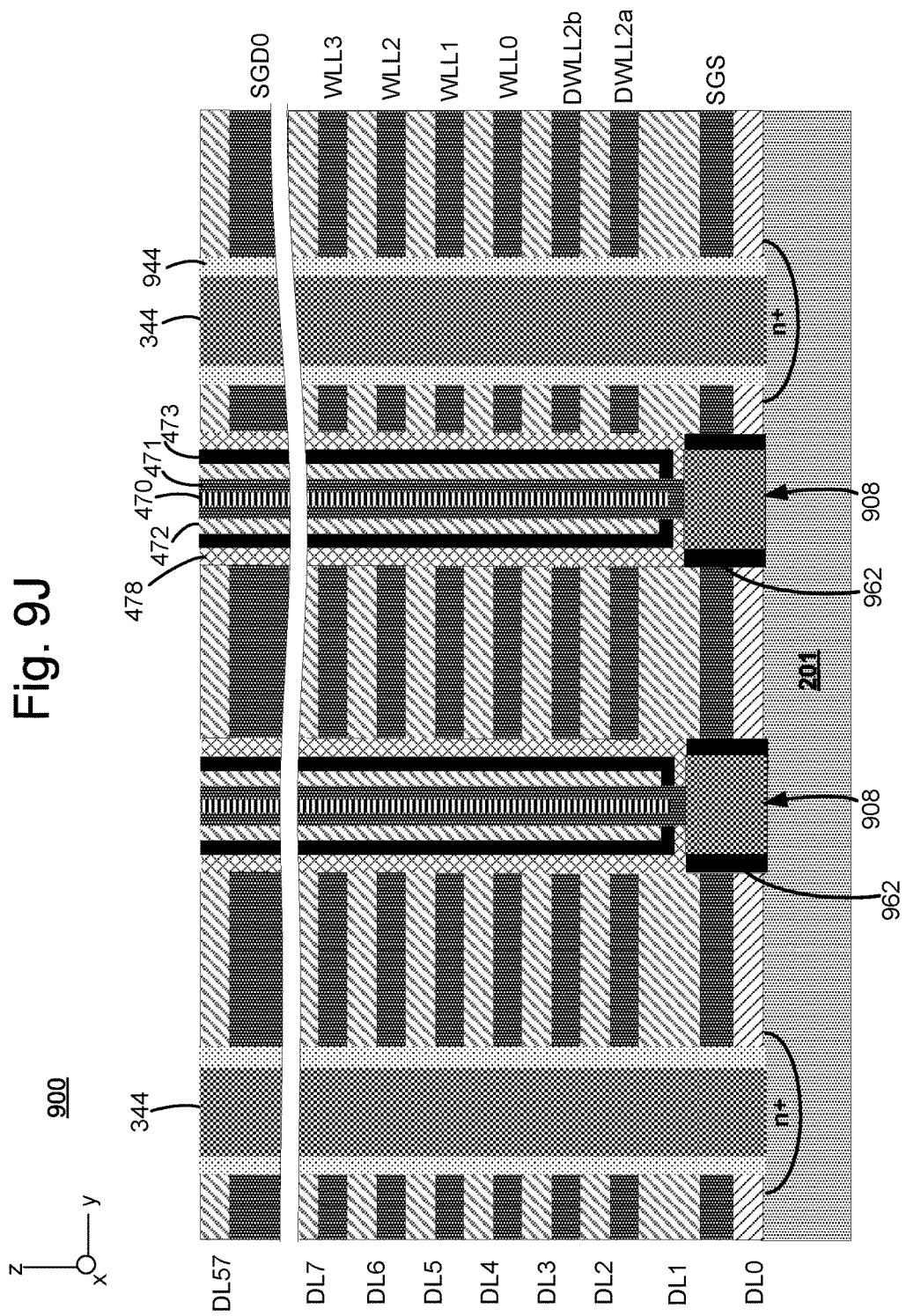

FIG. 9J depicts results after one embodiment of step 846. The gate oxide regions 962 are depicted on sidewalls of the silicon region 908. The recesses in the stack have been filled with a conductive material. Thus, the recess layers are re-labeled as SGS, DWLL2a, DWLL2b, WLL0, WLL1, WLL2, WLL3, and SGD0. As the aluminum oxide layer was described as being optional, it is not depicted in FIG. 9I. However, in one embodiment, there is an aluminum oxide layer 477 outside of the memory holes, as in FIG. 4D.

The source lines 344 are now formed in the slits. An insulating layer 944 provides electrical insulation between the source lines 344 and the conductive layers (SGS, DWLL2a, DWLL2b, WLL0, WLL1, WLL2, WLL3, and SGD0).

After step 846, additional steps may be performed to form bit line contacts, source line contacts, bit lines, global source lines, etc.

One embodiment disclosed herein includes a method of fabricating non-volatile storage. The method comprises forming an opening through a stack of alternating layers of a first material and a second material. The opening has a sidewall and extends to a semiconductor substrate. The method comprises forming a layer of silicon nitride over the sidewall of the opening. The method comprises cleaning a portion of the semiconductor substrate that is exposed in the opening. The cleaning is performed with the layer of silicon nitride in place over the sidewall. The method comprises forming a memory cell film in the opening after cleaning the semiconductor substrate.

In one embodiment, in addition to the steps of the previous paragraph, an exposed portion of the layer of silicon nitride in the opening is converted to an oxide after cleaning the semiconductor substrate. In one embodiment, the oxide comprises silicon oxide.

One embodiment disclosed herein includes a method of fabricating a three-dimensional memory array. The method comprises forming memory holes through a stack of alternating layers of a sacrificial material and silicon oxide. The memory holes each have a sidewall and extend to a crystalline semiconductor substrate. The method comprises forming a layer of silicon nitride over the sidewall of ones of the memory holes, and removing portions of the silicon nitride in the memory holes that cover the crystalline semiconductor substrate. The method comprises removing oxide from the crystalline semiconductor substrate that is exposed in the memory holes. The oxide is removed with the layers of silicon nitride in place over the sidewalls of the memory holes. The method comprises forming a crystalline semiconductor in the memory holes and in direct contact with the crystalline semiconductor substrate after removing the oxide from the crystalline semiconductor substrate. The method comprises forming a memory cell film in ones of the memory holes after forming the crystalline semiconductor in the memory holes.

One embodiment disclosed herein includes a method of fabricating non-volatile storage, which comprises the following. A stack of alternating layers of silicon oxide and silicon nitride are formed over a crystalline silicon substrate. The layers of silicon oxide and silicon nitride extend horizontally with respect to a major surface of the crystalline silicon substrate. Memory holes are etched in the alternating layers of silicon oxide and silicon nitride, each of the memory holes having a sidewall. The memory holes extend vertically with respect to the major surface of the crystalline silicon substrate. Silicon nitride is deposited over the sidewall in each of the memory holes. Silicon nitride that covers the crystalline silicon substrate at bottoms of the memory holes is removed. Silicon oxide is removed from the crystalline silicon substrate with the layer of silicon nitride in place over the sidewalls of the memory holes. Crystalline silicon is formed at the bottoms of the memory holes and in direct contact with the crystalline silicon substrate after removing the silicon oxide from the crystalline silicon substrate. An exposed portion of the layer of silicon nitride in the memory holes is converted to silicon oxide after forming the crystalline silicon at the bottoms of the memory holes. A charge trapping layer is formed on the silicon oxide in the memory holes. A tunnel dielectric is formed on the charge trapping layer in the memory holes. A channel for a NAND string is formed on the tunnel dielectric in the memory holes.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating non-volatile storage, the method comprising:
   forming an opening through a stack of alternating layers of a first material and a second material, the opening having a sidewall, the opening extending to a semiconductor substrate;

forming a protective layer of silicon nitride over the sidewall of the opening adjacent to the alternating layers of the first material and the second material;

removing oxide from a portion of the semiconductor substrate that is exposed in the opening, the removing oxide performed with the protective layer of silicon nitride exposed and in place over the sidewall adjacent to the alternating layers of the first material and the second material;

converting a portion of the protective layer of silicon nitride in the opening to an oxide after cleaning the portion of the semiconductor substrate;

forming layers of a memory cell film in the opening after cleaning the semiconductor substrate; and replacing the first material with a conductive material, wherein portions of the silicon nitride that were converted to the oxide are a blocking layer between the conductive material and the memory cell film.

2. The method of claim 1, wherein the memory cell film comprises a charge storage layer, wherein the silicon nitride that was converted to the oxide resides between the conductive material and the charge storage layer.

3. The method of claim 1, wherein the second material is silicon oxide.

4. The method of claim 3, wherein the first material is silicon nitride.

5. The method of claim 3, wherein the first material is polysilicon.

6. The method of claim 3, wherein removing the oxide from a portion of the semiconductor substrate comprises performing a dilute hydrofluoric acid (DHF) clean with the protective layer of silicon nitride exposed and in place over the sidewall adjacent to the alternating layers of the first material and the second material.

7. The method of claim 1, further comprising:

forming a semiconductor region in the opening using the semiconductor substrate as a crystalline substrate for epitaxial growth of the semiconductor region, wherein the memory cell film is formed after forming the semiconductor region.

8. The method of claim 1, wherein forming layers of a memory cell film in the opening after removing oxide from a portion of cleaning the semiconductor substrate comprises:

forming a charge trapping layer in the opening.

9. A method of fabricating a three-dimensional memory array, the method comprising:

forming memory holes through a stack of alternating layers of a sacrificial material and silicon oxide, the memory holes each having a sidewall, the memory holes extending to a crystalline semiconductor substrate;

forming a protective layer of silicon nitride over a sidewall of each of the memory holes;

removing portions of the layer of silicon nitride in the memory holes that covers the crystalline semiconductor substrate;

removing oxide from the crystalline semiconductor substrate that is exposed in the memory holes, removing the oxide being performed with the protective layers of silicon nitride in place over the sidewalls of the memory holes and exposed to a process that removes the oxide;

forming a crystalline semiconductor in the memory holes and in direct contact with the crystalline semiconductor substrate after removing the oxide from the crystalline semiconductor substrate;

converting a portion of the protective layer of silicon nitride in each of the memory holes that is not covered by the crystalline semiconductor to an oxide;

forming layers of a memory cell film in ones of the memory holes after forming the crystalline semiconductor in the memory holes; and replacing the sacrificial material with a conductive material for control gates, wherein the silicon nitride that was converted to the oxide serves as a blocking layer between the conductive material and the memory cell film.

10. The method of claim 9, wherein forming layers of memory cell film comprises forming a charge storage layer comprising a dielectric layer for charge trap regions of memory cells.

11. The method of claim 9, wherein forming layers of memory cell film comprises forming a charge storage layer comprising a conductive layer for floating gates of memory cells.

12. The method of claim 9, wherein converting a portion of the protective layers of silicon nitride in each of the memory holes that is not covered by the crystalline semiconductor to an oxide comprises:

converting an exposed portion of the layer of silicon nitride in the memory holes to silicon oxynitride, wherein the memory cell film is formed on the silicon oxynitride.

13. The method of claim 9, wherein the forming a crystalline semiconductor in the memory holes comprises growing a body for a source side select transistor using the crystalline semiconductor substrate as a crystalline substrate.

14. The method of claim 9, wherein converting the portion of the protective layer of silicon nitride in each of the memory holes that is not covered by the crystalline semiconductor to the oxide leaves the layer of silicon nitride that is covered by the crystalline semiconductor as silicon nitride.

15. The method of claim 14, wherein replacing the sacrificial material with the conductive material for control gates further comprises:

i) removing a portion of the layer of silicon nitride that was covered by the crystalline semiconductor, wherein removing the portion of the layer of silicon nitride that was covered by the crystalline semiconductor leaves a sidewall of the crystalline semiconductor in the memory holes exposed in a recess in the stack; and ii) leaving the oxide that was converted from the layer of silicon nitride in place in the memory holes.

16. The method of claim 15, further comprising forming a semiconductor oxide on the exposed sidewall of the crystalline semiconductor.

17. A method of fabricating non-volatile storage, the method comprising:

forming a stack of alternating layers of silicon oxide and silicon nitride over a crystalline silicon substrate, the layers of silicon oxide and silicon nitride extending horizontally with respect to a major surface of the crystalline silicon substrate;

etching memory holes in the alternating layers of silicon oxide and silicon nitride, each of the memory holes having a sidewall, the memory holes extending vertically with respect to the major surface of the crystalline silicon substrate;

depositing protective silicon nitride over the sidewall in each of the memory holes;

removing portions of the protective silicon nitride that covers the crystalline silicon substrate at bottoms of the memory holes;

removing silicon oxide from the crystalline silicon substrate with the protective silicon nitride exposed in place over the sidewalls of the memory holes;

forming crystalline silicon at the bottoms of the memory holes and in direct contact with the crystalline silicon substrate after removing the silicon oxide from the crystalline silicon substrate;

converting a portion of the protective silicon nitride in the memory holes that is not covered by the crystalline silicon at the bottoms of the memory holes to silicon oxide;

forming a charge trapping layer on the silicon oxide in the memory holes;

forming a tunnel dielectric on the charge trapping layer in the memory holes;

forming a channel for a NAND string on the tunnel dielectric in the memory holes;

removing the layers of silicon nitride from the stack leaving recesses in the stack between the layers of the silicon oxide; and depositing a conductive material for control gates of the NAND string in the recesses, wherein the silicon oxide in the memory holes is a blocking layer between the conductive material and the charge trapping layer.

\* \* \* \* \*